(12) United States Patent
Tatsumura et al.

(10) Patent No.: US 8,829,594 B2
(45) Date of Patent: Sep. 9, 2014

(54) NONVOLATILE PROGRAMMABLE SWITCHES

(75) Inventors: Kosuke Tatsumura, Kawasaki (JP); Kiwamu Sakuma, Yokohama (JP); Koichiro Zaitsu, Kawasaki (JP); Mari Matsumoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 13/469,867

(22) Filed: May 11, 2012

(65) Prior Publication Data

US 2013/0134499 A1    May 30, 2013

(30) Foreign Application Priority Data

Nov. 30, 2011    (JP) .................. 2011-262385

(51) Int. Cl.
   *H01L 29/792*    (2006.01)
(52) U.S. Cl.
   USPC .................. 257/324; 257/E29.309
(58) Field of Classification Search
   CPC ................................... H01L 29/792
   USPC ......................... 257/324, E29.309
   See application file for complete search history.

(56) References Cited

U.S. PATENT DOCUMENTS

| 5,587,603 | A | 12/1996 | Kowshik |
| 5,812,450 | A | 9/1998 | Sansbury et al. |
| 5,847,993 | A | 12/1998 | Dejenfelt |
| 6,002,610 | A | 12/1999 | Cong et al. |
| 6,356,478 | B1 | 3/2002 | McCollum |
| 6,970,383 | B1 * | 11/2005 | Han et al. .................. 365/185.28 |

* cited by examiner

*Primary Examiner* — Kevin Parendo
*Assistant Examiner* — Lamont Koo
(74) *Attorney, Agent, or Firm* — Finnegan, Henderson, Farabow, Garrett & Dunner, L.L.P.

(57) ABSTRACT

A nonvolatile programmable switch according to an embodiment includes: a first nonvolatile memory transistor including a first to third terminals connected to a first to third interconnects respectively; a second nonvolatile memory transistor including a fourth terminal connected to a fourth interconnect, a fifth terminal connected to the second interconnect, and a sixth terminal connected to the third interconnect, the first and second nonvolatile memory transistors having the same conductivity type; and a pass transistor having a gate electrode connected to the second interconnect. When the first and fourth interconnects are connected to a first power supply while the third interconnect is connected to a second power supply having a higher voltage than that of the first power supply, a threshold voltage of the first nonvolatile memory transistor increases, and a threshold voltage of the second nonvolatile memory transistor decreases.

7 Claims, 21 Drawing Sheets

4A

INITIALIZING

NONVOLATILE PROGRAMMABLE SWITCHES

CROSS-REFERENCE TO RELATED APPLICATION

This application is based upon and claims the benefit of priority from prior Japanese Patent Application No. 2011-262385 filed on Nov. 30, 2011 in Japan, the entire contents of which are incorporated herein by reference.

FIELD

Embodiments described herein relate generally nonvolatile programmable switches.

BACKGROUND

A programmable switch normally has a memory connected to the gate of a pass transistor functioning as a switch, and controls switching on and off of the pass transistor in accordance with data that is stored in the memory. A typical FPGA (Field Programmable Gate Array) is formed with logic elements and a programmable switch array. Each of the programmable switches serves to selectively connect the logic elements.

According to a known method, a nonvolatile programmable switch is formed with two nonvolatile memory transistors and a pass transistor. According to this method, the nonvolatile memory transistors can be of a floating gate type, for example. A supply voltage (Vdd) or grand voltage (0 V) is input to the gate of the pass transistor via one of the two nonvolatile memory transistors. In a case where writing in the nonvolatile memory transistors is performed by a FN (Fowler-Nordheim) tunneling current write method (hereinafter also referred to as the FN method), the respective gates of the two nonvolatile memory transistors need to be connected to different word lines. This is because different gate voltages have to be applied to the two nonvolatile memory transistors in order to realize selective writing (one of the two nonvolatile memory transistors is selectively written).

According to another known method, a programmable logic switch is formed with two nonvolatile memory transistors, a pass transistor, and an access transistor. The nonvolatile memory transistors can be of a floating gate type, for example. Vdd or 0 V is input to the gate of the pass transistor via one of the two nonvolatile memory transistors. According to this method, the gates of the two nonvolatile memory transistors are connected to the same word line, and selective writing is performed by a channel hot electron write method (hereinafter also referred to as the CHE method).

The limit size of a writable memory transistor according to the FN method is normally smaller than the limit size of a writable memory transistor according to the CHE method. According to the CHE method, high-energy electrons (hot electrons) generated due to a potential difference between the source and the drain are injected into the charge storage film by a voltage applied to the gate. Normally, in a region where the gate length of the transistor is 100 nm or shorter, the hot electron injection efficiency becomes smaller as the gate length becomes shorter.

The cell area of a programmable switch is smaller where the number of word lines per cell is smaller and the memory transistor size is smaller. With smaller cell areas, a larger number of circuit components can be mounted on a chip with the same area, and a high-performance FPGA can be realized. Alternatively, the same number of circuit components can be mounted on a chip with a smaller area, and the cost per chip can be lowered.

Therefore, to realize a nonvolatile programmable switch having a smaller area, there is a demand for a cell structure in which the FN method is applicable and the number of word lines per cell is one. At present, however, there is not a known method for realizing such a cell structure.

DETAILED DESCRIPTION

A nonvolatile programmable switch according to an embodiment includes: a first nonvolatile memory transistor including a first terminal connected to a first interconnect, a second terminal connected to a second interconnect, and a third terminal connected to a third interconnect; a second nonvolatile memory transistor including a fourth terminal connected to a fourth interconnect, a fifth terminal connected to the second interconnect, and a sixth terminal connected to the third interconnect, the second nonvolatile memory transistor being of the same conductivity type as a conductivity type of the first nonvolatile memory transistor; and a pass transistor having a gate electrode connected to the second interconnect. When the first interconnect and the fourth interconnect are connected to a first power supply while the third interconnect is connected to a second power supply of a higher voltage than a voltage of the first power supply, a threshold voltage of the first nonvolatile memory transistor increases, and a threshold voltage of the second nonvolatile memory transistor decreases, and when the first interconnect and the fourth interconnect are connected to the first power supply while the third interconnect is connected to a third power supply of a lower voltage than the voltage of the first power supply, the threshold voltage of the first nonvolatile memory transistor decreases, and the threshold voltage of the second nonvolatile memory transistor increases.

The following is a description of embodiments, with reference to the accompanying drawings.

(First Embodiment)

Figure 1:
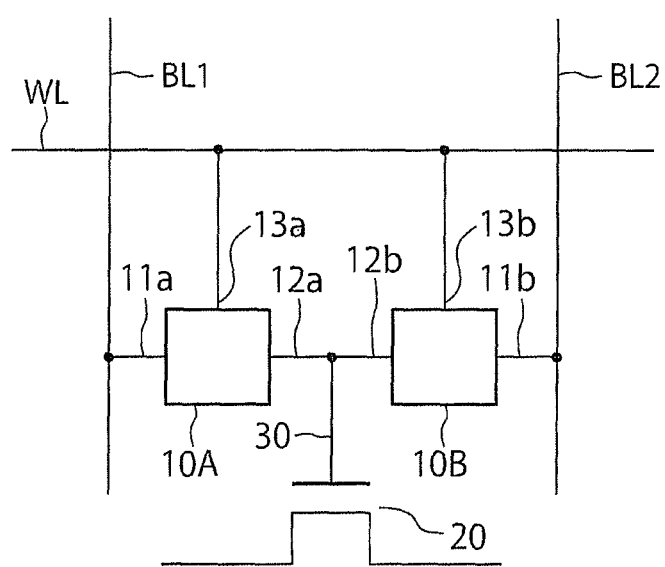
FIG. 1 is a circuit diagram showing a cell according to a first embodiment.

FIG. 1 shows a nonvolatile programmable switch according to a first embodiment. This nonvolatile programmable switch 4 includes first and second nonvolatile memory transistors (hereinafter also referred to as memory transistors) 10A and 10B, a pass transistor 20, and an interconnect 30, and forms one cell. Hereinafter, the nonvolatile programmable switch 4 will be also referred to as the switch 4 or cell 4.

The first memory transistor 10A includes a first terminal 11a connected to an interconnect BL1, a second terminal 12a connected to the interconnect 30, and a third terminal 13a connected to an interconnect WL. In the first memory transistor 10A, the first terminal 11a is one of a source and a drain, the second terminal 12a is the other one of the source and the drain, and the third terminal 13a is a gate, for example. Likewise, the second memory transistor 10B includes a first terminal 11b connected to an interconnect BL2, a second terminal 12b connected to the interconnect 30, and a third terminal 13b connected to the interconnect WL. In the second memory transistor 10B, the first terminal 11b is one of a source and a drain, the second terminal 12b is the other one of the source and the drain, and the third terminal 13b is a gate electrode, for example.

The pass transistor 20 has a gate electrode connected to the interconnect 30, and has a source and a drain connected to external interconnects, respectively.

Accordingly, the first and second memory transistors 10A and 10B have the third terminals 13a and 13b connected to the same interconnect WL, and have the second terminals 12a and 12b connected to the gate electrode of the pass transistor 20 via the interconnect 30.

Figure 2:
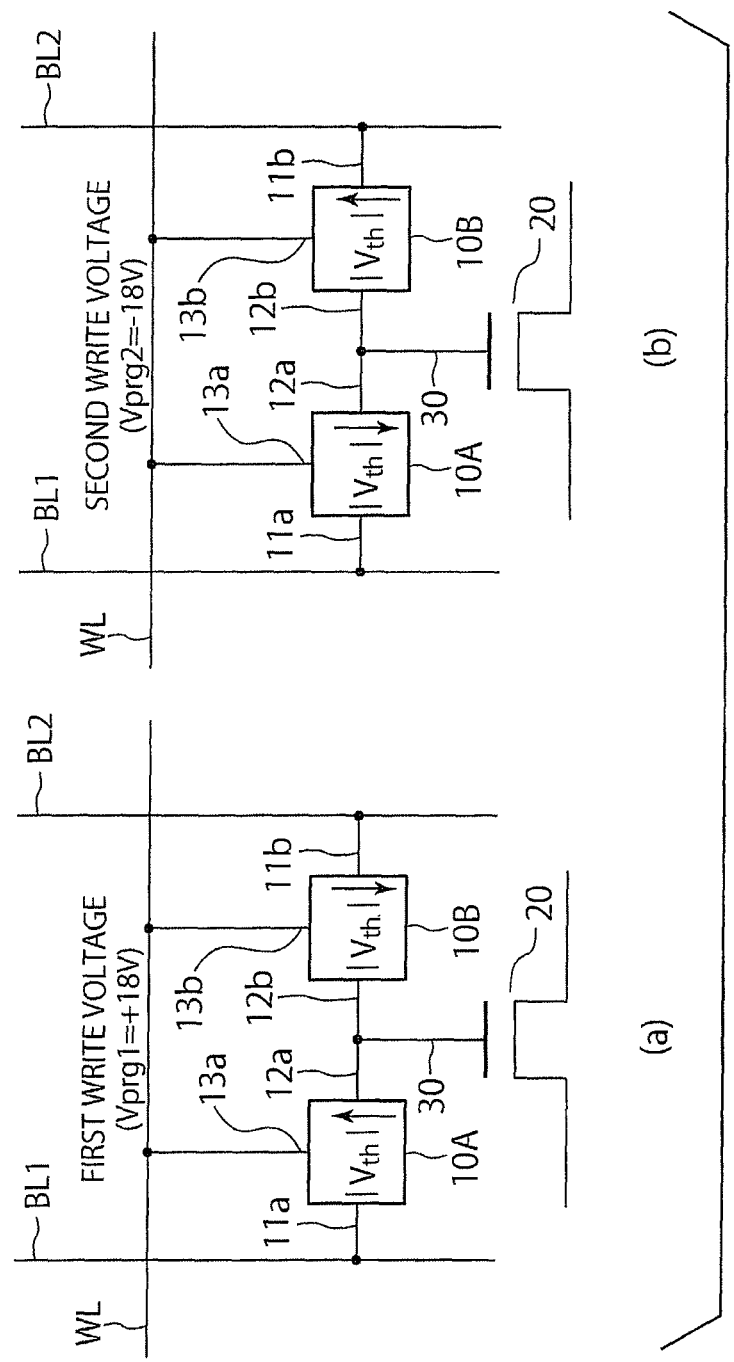
FIGS. 2(a) and 2(b) are circuit diagrams for explaining operations of the cell according to the first embodiment.

In the switch 4 having the above structure, when a first write voltage Vprg1 is applied to the interconnect WL, the absolute value of the threshold voltage (also referred to simply as the threshold) $V_{th}$ of the first memory transistor 10A becomes greater, and the absolute value of the threshold voltage $V_{th}$ of the second memory transistor 10B becomes smaller (see FIG. 2(a)). When a second write voltage Vprg2 (<Vprg1) that is lower than the first write voltage Vprg1 is applied to the interconnect WL, the absolute value of the threshold voltage $V_{th}$ of the first memory transistor 10A becomes smaller, and the absolute value of the threshold voltage $V_{th}$ of the second memory transistor 10B becomes greater (see FIG. 2(b)).

Figure 3:
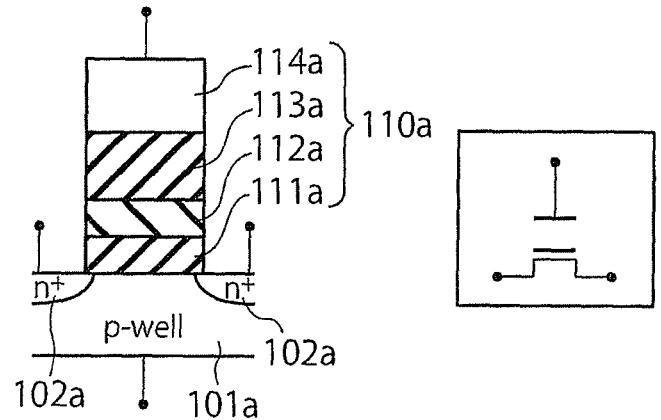
FIGS. 3(a) and 3(b) are diagrams showing a first specific example of a first memory transistor.

FIG. 3(a) shows a first specific example structure of the first memory transistor 10A. As shown in FIG. 3(a), the memory transistor 10a of the first specific example is an n-channel transistor formed on a p-type semiconductor region (a p-well, for example) 101a, and includes n-type source/drain regions 102a formed at a distance from each other in the p-well 101a, and a gate structure 110a formed on the region (the channel) of the p-well 101a located between the source/drain regions 102a. The p-type semiconductor region can be a p-type semiconductor substrate, instead of a p-well. The gate structure 110a has a structure formed by stacking an insulating film (a tunneling film) 111a, a charge storage film 112a, an insulating film (a blocking film) 113a, and a gate electrode 114a in this order. One of the source/drain regions 102a is connected to the interconnect BL1 shown in FIG. 1, and the other one is connected to the interconnect 30. The gate electrode 114a is connected to the interconnect WL. The film thickness of the insulating film 111a is smaller than the film thickness of the insulating film 113a, or the mean relative permittivity of the insulating film 111a is lower than the mean relative permittivity of the insulating film 113a. Where an insulating film is formed with n (≥1) layers, $T_i$ represents the physical layer thickness of the i (n≥i≥1) th layer, $\epsilon_i$ represents the relative permittivity, the mean relative permittivity $\epsilon_{ave}$ of the insulating film is expressed by the following equation:

$$\varepsilon_{ave} = \frac{\sum_{i=1}^{n} T_i}{\sum_{i=1}^{n} T_i / \varepsilon_i}$$

In this specification, the memory transistor 10a of the first specific example is represented by the symbol shown in FIG. 3(b).

In the memory transistor 10a of the first specific example, the insulating film 111a is a stack structure SiO$_2$ (2.5 nm)/SiN (1 nm)/SiO$_2$ (2.5 nm), the charge storage film 112a is SiN (5 nm), and the insulating film 113a is a stack structure SiO$_2$ (3.5 nm)/SiN (3.5 nm)/SiO$_2$ (3.5 nm), for example. Here, the symbol "A/B" means that "A" is the upper layer while "B" is the lower layer, and the numerical values shown in parentheses indicate layer thicknesses. Accordingly, the film thickness of the insulating film 111a is 6 nm, the film thickness of the insulating film 113a is 10.5 nm, and the film thickness of the insulating film 111a is smaller than the film thickness of the insulating film 113a. Since the relative permittivity of SiO$_2$ is 3.9 while the relative permittivity of SiN is 8, the mean relative permittivity of the insulating film 111a is 4.26, and the mean relative permittivity of the insulating film 113a is 4.70. That is, the mean relative permittivity of the insulating film 111a is lower than the mean relative permittivity of the insulating film 113a.

The film thicknesses, materials, and compositions of the insulating films 111a and 113a, the charge storage film 112a, and the gate electrode 114a can be made apparent by cutting out a corresponding portion from the memory transistor 10a by a pickup technique using a FIB (Focused Ion Beam), and capturing an image of the cross-sectional surface with a high-resolution transmission electron microscope (HRTEM) or analyzing the cross-sectional surface with an energy dispersive X-ray analysis (EDX) or electron energy-loss spectroscopy (EELS).

FIGS. 4(a) and 4(b) show write voltages in the first memory transistor 10a of the first specific example. In the first memory transistor 10a of the first specific example, the first write voltage Vprg1 is +18 V, and the second write voltage Vprg2 is −18 V, for example. As shown in FIG. 4(a), in a case where the voltage applied to the source/drain regions 102a and the p-well 101a is 0 V, and the first write voltage Vprg1 (+18 V) is applied to the gate electrode in the first memory transistor 10a, electrons in the channel pass through the insulating film 111a by virtue of a tunneling phenomenon (a FN tunneling current), are injected into the charge storage film 112a, and are trapped and stored in the charge storage film 112a. Since the film thickness of the insulating film 113a is greater than the film thickness of the insulating film 111a, the amount of electrons flowing from the charge storage film 112a to the gate electrode 114a is smaller than the amount of electrons flowing from the channel to the charge storage film 113a. That is, the amount of charges (electrons) trapped in the charge storage film 112a becomes larger.

Also, since the mean relative permittivity of the insulating film 113a is higher than the mean relative permittivity of the insulating film 111a, the electric field applied to the insulating film 113a is smaller than the electric field applied to the insulating film 111a. As a result, the amount of electrons flowing from the charge storage film 112a to the gate electrode 114a is smaller than the amount of electrons flowing from the channel to the charge storage film 112a.

In the first memory transistor 10a of the first specific example, the film thickness of the insulating film 113a is greater than the film thickness of the insulating film 111a, and the mean relative permittivity of the insulating film 113a is higher than the mean relative permittivity of the insulating film 111a. Therefore, the amount of electrons flowing from the charge storage film 112a to the gate electrode 114a is much smaller than the amount of electrons flowing from the channel to the charge storage film 112a.

The negative charges (electrons) stored in the charge storage film 112a in the above manner increase the threshold voltage of the n-channel memory transistor 10a to a high threshold. This high threshold is 4 V, for example.

As shown in FIG. 4(b), in a case where the voltage applied to the source/drain regions 102a and the p-well 101a is 0 V, and the second write voltage Vprg2 (−18 V) is applied to the gate electrode 114a while the first memory transistor 10a is in a high threshold state, electrons stored in the charge storage film 112a pass through the insulating film 111a by virtue of a tunneling phenomenon, and are released into the channel. Since the film thickness of the insulating film 113a is greater than the film thickness of the insulating film 111a, the amount of electrons flowing from the gate electrode 114a to the charge storage film 112a is smaller than the amount of electrons flowing from the charge storage film 112a to the channel. Also, since the mean relative permittivity of the insulating film 113a is higher than the mean relative permittivity of the insulating film 111a, the electric field applied to the insulating film 113a is smaller than the electric field applied to the insulating film 111a. Therefore, the amount of electrons flowing from the gate electrode 114a to the charge storage film 112a is smaller than the amount of electrons flowing from the charge storage film 112a to the channel.

In the first memory transistor 10a of the first specific example, the film thickness of the insulating film 113a is greater than the film thickness of the insulating film 111a, and the mean relative permittivity of the insulating film 113a is higher than the mean relative permittivity of the insulating film 111a. Therefore, the amount of electrons flowing from the gate electrode 114a to the charge storage film 112a is much smaller than the amount of electrons flowing from the charge storage film 112a to the channel.

As the second write voltage Vprg2 (−18 V) is applied in a state where charges are stored in the charge storage film 112a (a high threshold state) in the above manner, the charge storage film 112a returns to the original neutral state, and accordingly, the threshold voltage becomes the original low threshold. This low threshold is 0 V, for example. If the second write voltage Vprg2 (−18 V) is applied to the first memory transistor 10a in a state where no charges are stored in the charge storage film 112a (a low threshold state), no charges are transferred, and the low threshold state is maintained.

Figure 5:
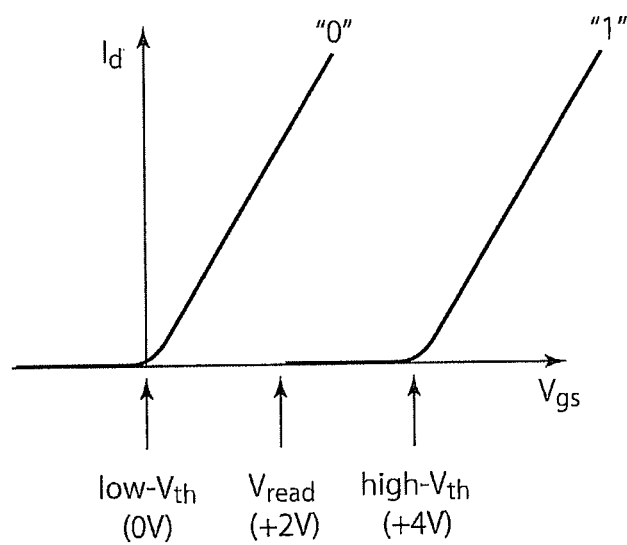
FIG. 5 is a graph showing the $I_d$-$V_{gs}$ characteristics of the first memory transistor.

FIG. 5 shows the drain current ($I_d$)-gate voltage ($V_{gs}$) characteristics in a case where the first memory transistor 10a is in a high threshold state (a data "1" state, for example) and in a case where the first memory transistor 10a is in a low threshold state (a data "0" state, for example). Alternatively, the high threshold state can be associated with the data "0" state, and the low threshold state can be associated with the data "1" state.

Figure 6:
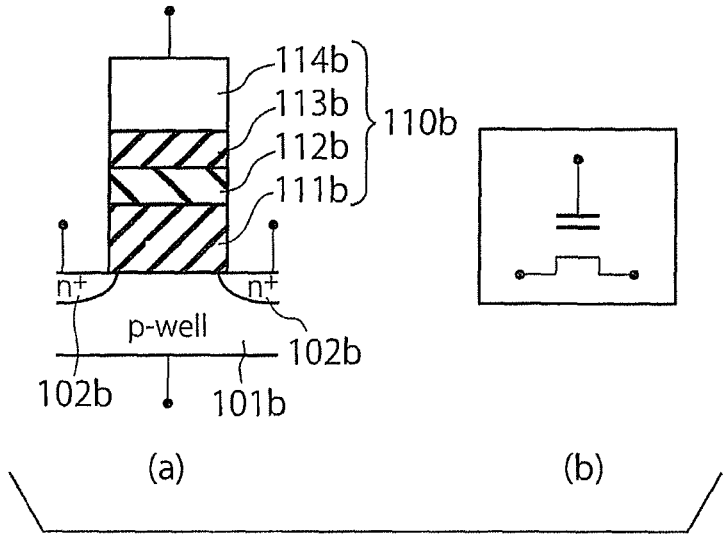
FIGS. 6(a) and 6(b) are diagrams showing a first specific example of a second memory transistor.

FIG. 6(a) shows a first specific example structure of the second memory transistor 10B. As shown in FIG. 6(a), the memory transistor 10b of the first specific example is an n-channel transistor formed on a p-type semiconductor region (a p-well, for example) 101b, and includes n-type source/drain regions 102b formed at a distance from each other in the p-well 101b, and a gate structure 110b formed on the region (the channel) of the p-well 101b located between the source/drain regions 102b. The p-type semiconductor region can be a p-type semiconductor substrate, instead of a p-well. The gate structure 110b has a structure formed by stacking an insulating film (a blocking film) 111b, a charge storage film 112b, an insulating film (a tunneling film) 113b, and a gate electrode 114b in this order. One of the source/drain regions 102b is connected to the interconnect BL2 shown in FIG. 1, and the other one is connected to the interconnect 30. The gate electrode 114b is connected to the interconnect WL. The film thickness of the insulating film 111b is greater than the film thickness of the insulating film 113b, or the mean relative permittivity of the insulating film 111b is higher than the mean relative permittivity of the insulating film 113b.

In the second memory transistor 10b of the first specific example, the insulating film 111b is a stack structure $SiO_2$ (3.5 nm)/SiN (3.5 nm)/$SiO_2$ (3.5 nm), the charge storage film 112b is SiN (5 nm), and the insulating film 113b is a stack structure $SiO_2$ (2.5 nm)/SiN (1 nm)/$SiO_2$ (2.5 nm), for example. Accordingly, the film thickness of the insulating film 111b is 10.5 nm, the film thickness of the insulating film 113b is 6 nm, and the film thickness of the insulating film 111b is greater than the film thickness of the insulating film 113b. The mean relative permittivity of the insulating film 111b is 4.70, and the mean relative permittivity of the insulating film 113b is 4.26. That is, the mean relative permittivity of the insulating film 111b is higher than the mean relative permittivity of the insulating film 113b.

Figure 7:
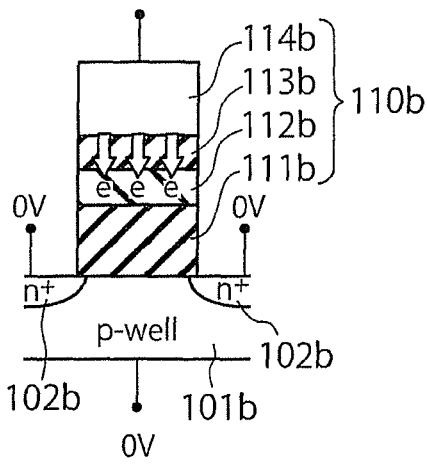
FIGS. 7(a) and 7(b) are diagrams showing write voltages in the second memory transistor.
Figure 7:
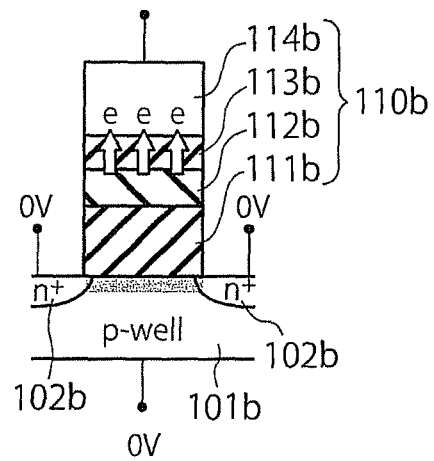

FIGS. 7(a) and 7(b) show write voltages in the second memory transistor 10b of the first specific example. In the second nonvolatile memory transistor 10b of the first specific example, the voltage applied to the source/drain regions 102b and the p-well 101b is 0 V, and the second write voltage Vprg2 (−18 V) is applied to the gate, as shown in FIG. 7(a). In that case, electrons in the gate electrode 114b pass through the insulating film 113b by virtue of a tunneling phenomenon, are injected into the charge storage film 112b, and are trapped in the charge storage film 112b. Since the film thickness of the insulating film 111b is greater than the film thickness of the insulating film 113b, the amount of electrons flowing from the charge storage film 112b to the channel is smaller than the amount of electrons flowing from the gate electrode 114b to the charge storage film 112b.

Also, since the mean relative permittivity of the insulating film 111b is higher than the mean relative permittivity of the insulating film 113b, the electric field applied to the insulating film 111b is smaller than the electric field applied to the insulating film 113b. As a result, the amount of electrons flowing from the charge storage film 112b to the channel is smaller than the amount of electrons flowing from the gate electrode 114b to the charge storage film 112b.

In the second memory transistor 10b of the first specific example, the film thickness of the insulating film 111b is greater than the film thickness of the insulating film 113b, and the mean relative permittivity of the insulating film 111b is higher than the mean relative permittivity of the insulating film 113b. Therefore, the amount of electrons flowing from the charge storage film 112b to the channel is much smaller than the amount of electrons flowing from the gate electrode 114b to the charge storage film 112b. The negative charges stored in the charge storage film 112b increase the threshold of the n-channel transistor. This high threshold is 4 V, for example.

As shown in FIG. 7(b), in a case where the voltage applied to the source/drain regions 102b and the p-well 101b is 0 V, and the first write voltage Vprg1 (+18 V) is applied to the gate electrode 114b while the second memory transistor 10b of the first specific example is in a high threshold state, negative charges (electrons) stored in the charge storage film 112b pass through the insulating film 113b by virtue of a tunneling phenomenon, and are released into the gate electrode 114b. Since the film thickness of the insulating film 111b is greater than the film thickness of the insulating film 113b, the amount of electrons flowing from the channel to the charge storage film 112b is smaller than the amount of electrons flowing from the charge storage film 112b to the gate electrode 114b. Also, since the mean relative permittivity of the insulating film 111b is higher than the mean relative permittivity of the insulating film 113b, the electric field applied to the insulating film 111b is smaller than the electric field applied to the insulating film 113b. Therefore, the amount of electrons flowing from the channel to the charge storage film 112b is smaller than the amount of electrons flowing from the charge storage film 112b to the gate electrode 114b.

In the second memory transistor 10b of the first specific example, the film thickness of the insulating film 111b is greater than the film thickness of the insulating film 113b, and the mean relative permittivity of the insulating film 111b is higher than the mean relative permittivity of the insulating film 113b. Therefore, the amount of electrons flowing from the channel to the charge storage film 112b is much smaller than the amount of electrons flowing from the charge storage film 112b to the gate electrode 114b. As a result of this, the charge storage film 112b returns to the original neutral state, and accordingly, the threshold becomes the original low threshold. This low threshold is 0 V, for example. If the first write voltage Vprg1 is applied to the second memory transistor 10b in a state where no charges are stored in the charge storage film 112b (a low threshold state), no charges are transferred, and the low threshold state is maintained.

Figure 8:
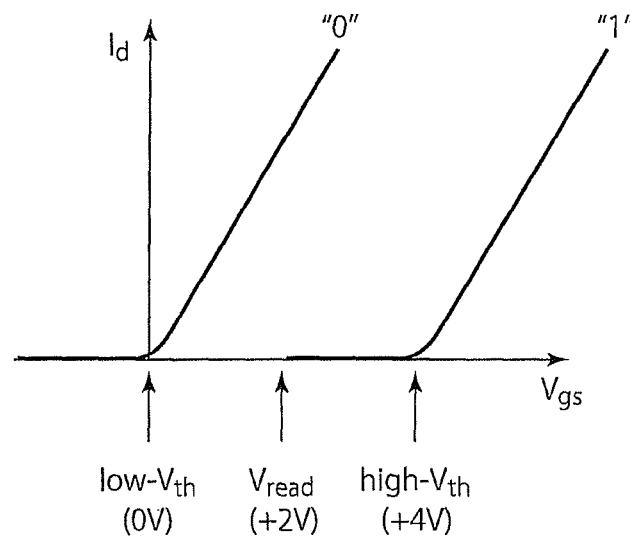
FIG. 8 is a graph showing the $I_d$-$V_{gs}$ characteristics of the second memory transistor.

FIG. 8 shows the drain current ($I_d$)-gate voltage ($V_{gs}$) characteristics in a case where the second memory transistor 10b of the first specific example is in a high threshold state (a data "1" state, for example) and in a case where the second memory transistor 10b is in a low threshold state (a data "0" state, for example).

The first and second memory transistors of the first specific example are MONOS (Metal-Oxide-Nitride-Oxide-Semiconductor) nonvolatile memory transistors in which the charge storage films 112a and 112b are trapping insulating films that trap charges. Instead of the trapping insulating films, polysilicon, polysilicon doped with n-type impurities, or polysilicon doped with p-type impurities can be used. In that case, the first and second memory transistors become nonvolatile memory transistors of a floating gate type (FG type). Also, the charge storage films 112a and 112b can be stack structures formed with polysilicon and a SiN film. Further, the charge storage films 112a and 112b can include a layer containing fine particles (dots) made of a metal or a semiconductor.

In the first and second memory transistors of the first specific example, the insulating film 113a and the insulating film 111b each have the stack structure $SiO_2$ (3.5 nm)/SiN (3.5 nm)/$SiO_2$ (3.5 nm). Instead of this stack structure, a material with a high relative permittivity can be used. The material with a high relative permittivity can be an Hf oxide, a Zr oxide, a Ta oxide, a Ti oxide, a La oxide, an Al oxide, a mixture of those oxides, LaAlO, or the like.

In the first and second memory transistors 10a and 10b of the first specific example, it is important that the insulating film 113a and the insulating film 111b block electrons from passing therethrough (blocking performance). Where χ represents an electron affinity, the blocking performance becomes higher with an insulating material with a lower electron affinity χ. If a stack structure is formed with low-χ material layer/high-χ material layer/low-χ material layer, the blocking performance can be improved by virtue of a charging effect. Here, the charging effect is the effect to: 1) trap electrons in the high-χ material layer interposed between the low-χ material layers at the time of initial writing, and negatively charge the high-χ material layer; and 2) lower the effective χ of the high-χ material layer through the negative charging, and improve the blocking performance. In many cases, the relative permittivity c of a material is proportional to χ of the material. Therefore, each high-χ material is a high-ε material, and each low-χ material is a low-ε material. In view of this, the stack structure having a high-χ material layer (a high-ε material layer) interposed between low-χ material layers (low-ε material layers) can have a high mean relative permittivity $\varepsilon_{avg}$ and a low effective χ. Accordingly, high blocking performance can be provided. The electron affinity χ of $SiO_2$ is 0.95 eV. The electron affinity χ of SiN ($Si_3N_4$) having a stoichiometric composition is 1.32 eV. The electron affinity χ of SiN ($SiN_x$: x<1.33) having a Si-rich composition to increase the trap density becomes larger as the composition ratio x becomes lower at 1.32 eV or higher. For example, χ is 2.01 eV where x is 1.20, and χ is 2.70 eV where x is 1.07. In the first and second memory transistors 10$a$ and 10$b$ of the first specific example, each of the insulating film 113$a$ and the insulating film 111$b$ is formed with $SiO_2$ (3.5 nm)/SiN (3.5 nm)/$SiO_2$ (3.5 nm), which is a film stack formed with low-χ material layer/high-χ material layer/low-χ material layer. It is also possible to use a stack structure in which an Hf oxide, a Zr oxide, a Ta oxide, a Ti oxide, a La oxide, an Al oxide, a mixture of those oxides, or LaAlO is interposed between $SiO_2$ layers or SiN layers.

Figure 9:
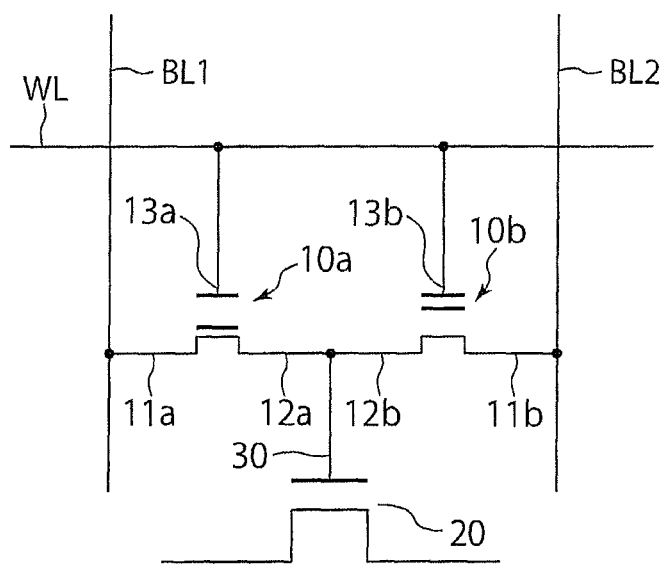
FIG. 9 is a circuit diagram showing a first specific example of the cell according to the first embodiment.

FIG. 9 shows a switch 4A of the first specific example of the first embodiment. The switch 4A of the first specific example includes the memory transistors 10$a$ and 10$b$ of the first specific example shown in FIGS. 3($a$) and 6($a$), as the first and second memory transistors 10A and 10B, respectively. When the first write voltage Vprg1 (+18 V) is applied to the interconnect WL in the switch 4A of the first specific example, the threshold voltage of the first memory transistor 10$a$ can be made higher, and the threshold voltage of the second memory transistor 10$b$ can be made lower, by the writing with a FN tunneling current, as described above. When the second write voltage Vprg2 (−18 V) is applied to the interconnect WL, the threshold voltage of the first memory transistor can be made lower, and the threshold voltage of the second memory transistor can be made higher.

As described above, according to the first embodiment, writing with a FN current can be performed, and the two memory transistors are driven through the common interconnect WL. Accordingly, the cell area can be made smaller.

In the first embodiment, the first and second memory transistors 10A and 10B are n-channel transistors. Therefore, the first and second memory transistors 10A and 10B can be formed on wells of the same conductivity type, and there is no need to form a device isolating region such as a STI (Shallow Trench Isolation) region. Accordingly, the cell area can be made smaller than that in a case where the first and second memory transistors are an n-channel transistor and a p-channel transistor, and are formed on wells of different conductivity types.

(Second Embodiment)

Figure 10:
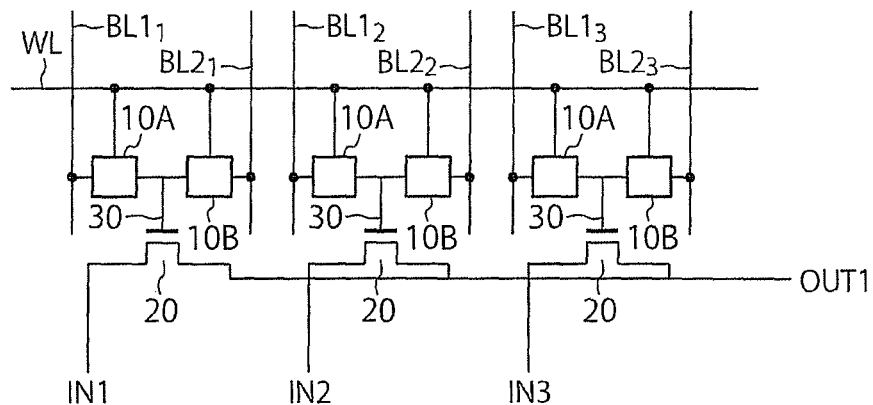
FIG. 10 is a circuit diagram showing a MUX according to a second embodiment.

FIG. 10 shows a multiplexer (hereinafter also referred to as MUX) according to a second embodiment. The MUX 1 of this embodiment includes three cells 4$_1$, 4$_2$, and 4$_3$. Each cell 4$_i$ (i=1, 2, 3) has the same structure as that of the switch 4 shown in FIG. 1, and includes the first and second memory transistors 10A and 10B, the pass transistor 20, and the interconnect 30. In each cell 4$_i$ (i=1, 2, 3), one of the source and the drain of the first memory transistor 10A is connected to an interconnect BL1$_i$, the other one of the source and the drain is connected to the interconnect 30, and the gate electrode is connected to the interconnect WL. In each cell 4$_i$ (i=1, 2, 3), one of the source and the drain of the second memory transistor 10B is connected to an interconnect BL2$_i$, the other one of the source and the drain is connected to the interconnect 30, and the gate electrode is connected to the interconnect WL. That is, the interconnect WL is a common interconnect for each cell 4$_i$ (i=1, 2, 3). In each cell 4$_i$ (i=1, 2, 3), the gate electrode of the pass transistor 20 is connected to the interconnect 30, one of the source and the drain is connected to an input signal line IN$i$, and the other one of the source and the drain is connected to an output signal line OUT1. Accordingly, the MUX 1 of the second embodiment is designed to select a predetermined one of three input signals that are input to three input signal lines IN1, IN2, and IN3, and output the selected signal to the output signal line OUT1. The MUX 1 of the second embodiment is one of basic circuits for nonvolatile FPGAs.

Figure 11:
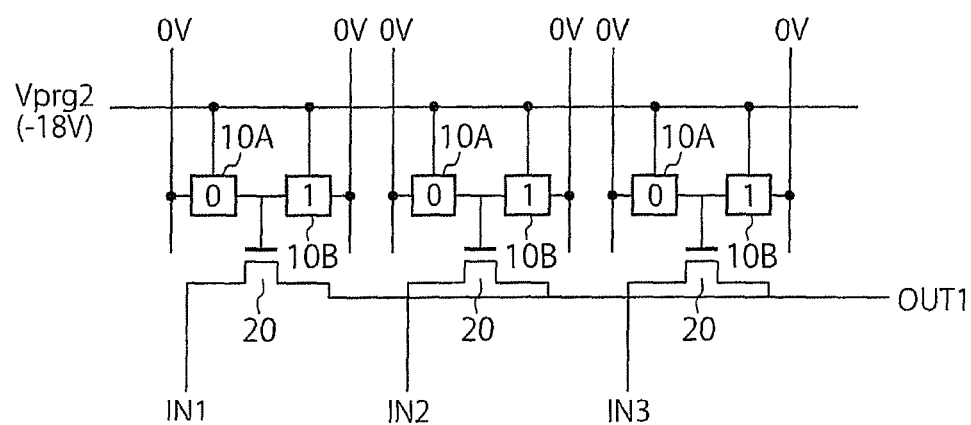
FIG. 11 is a circuit diagram showing a MUX according to the second embodiment.
Figure 12:
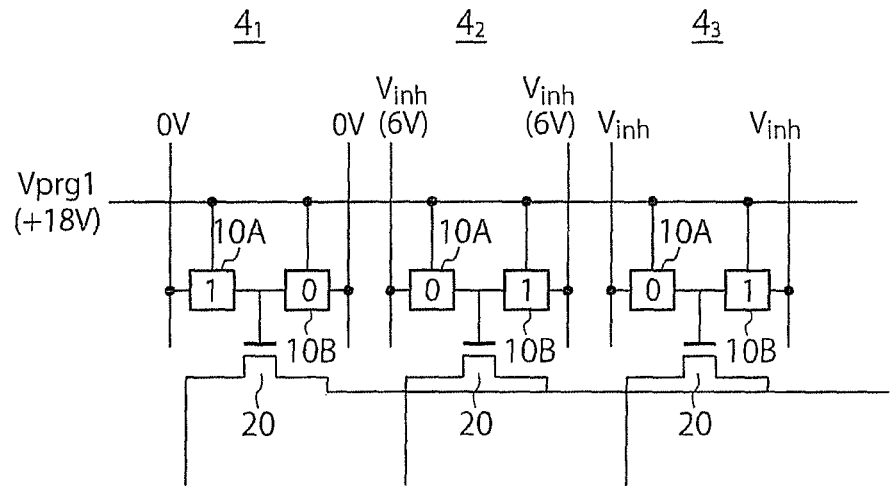
FIG. 12 is a circuit diagram showing a MUX according to the second embodiment.
Figure 13:
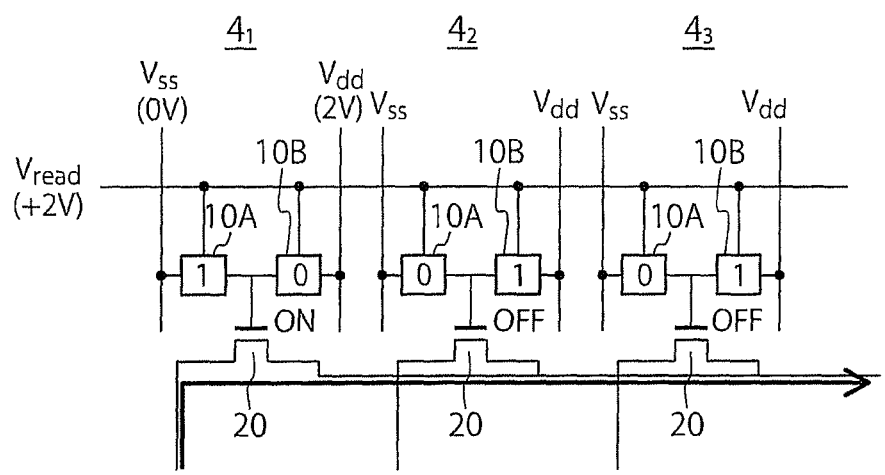
FIG. 13 is a circuit diagram showing a MUX according to the second embodiment.

Referring now to FIGS. 11 through 13, operations to be performed by the MUX 1 of the second embodiment, including an initializing operation, a selective writing operation, and a MUX operation (a FPGA operation), are described. In the example described below, the MUX 1 is programmed so that a signal from the input signal line IN1 is output from the output signal line OUT1, and signals from the input signal lines IN2 and IN3 are shut off. That is, the MUX 1 is programmed so that the pass transistor 20 is on in the cell 4$_1$, and the pass transistors 20 are off in the cells 4$_2$ and 4$_3$.

FIG. 11 illustrates the initializing operation. The second write voltage Vprg2 (−18 V) is applied to the interconnect WL, and 0 V is applied to each interconnect BL1$_i$ (i=1, 2, 3) and each BL2$_i$ (i=1, 2, 3). As a result, the threshold voltages of the first memory transistors 10A of all the cells 4$_1$, 4$_2$, and 4$_3$ become lower (the "0" state), and the threshold voltages of the second memory transistors 10B of all the cells 4$_1$, 4$_2$, and 4$_3$ become higher (the "1" state).

FIG. 12 illustrates the selective writing operation. The first write voltage Vprg1 (+18 V) is applied to the interconnect WL, 0 V is applied to the interconnects BL1$_1$ and BL2$_1$ of the cell 4$_1$, which is the selected cell, and a write inhibit voltage $V_{inhibit}$ is applied to the interconnects BL1$_2$, BL2$_2$, BL1$_3$, and BL2$_3$ of the cells 4$_2$ and 4$_3$, which are the non-selected cells. In the second embodiment, the write inhibit voltage $V_{inhibit}$ is 6 V, for example. As a result, the threshold voltage of the first memory transistor 10A of the cell 4$_1$ becomes higher (the "1" state), and the threshold of the second memory transistor 10B of the cell 4$_1$ becomes lower (the "0" state). While the voltage applied between the channel and the gate electrode of the selected cell 4$_1$ is 18 V, the voltage applied between the channel and the gate electrode of each of the non-selected cells 4$_2$ and 4$_3$ is as low as 12 V. Therefore, writing through FN current injection does not occur in the non-selected cells 4$_2$ and 4$_3$.

FIG. 13 illustrates the MUX operation (the FPGA operation). Vss (0 V) is applied to the interconnect BL1$_1$ to which the first memory transistor 10A of each cell 4$_i$ (i=1, 2, 3) is connected, and Vdd (2 V, for example) is applied to the interconnect BL2$_i$ to which the second memory transistor 10B is connected. A read voltage $V_{read}$ (2 V, for example) is applied to the interconnect WL. As shown in FIG. 5, when the first memory transistor 10A having $V_{read}$ (2 V) applied to the gate thereof is in the low threshold state (the "0" state), the resistance between the source and the drain becomes lower, and the first memory transistor 10A allows an input signal to pass. When the first memory transistor 10A is in the high threshold state (the "1" state), on the other hand, the resistance between the source and the drain becomes higher, and the first memory transistor 10A shuts off an input signal. Likewise, as shown in FIG. 8, when the second memory transistor 10B having $V_{read}$ (2 V) applied to the gate thereof is in the low threshold state (the "0" state), the resistance between the source and the drain becomes lower, and the second memory transistor 10B allows an input signal to pass. When the second memory transistor 10B is in the high threshold state (the "1" state), on the other hand, the resistance between the source and the drain becomes higher, and the second memory transistor 10B shuts off an input signal. Vdd is applied to the gate of the pass transistor 20 of the cell $4_1$ via the second memory transistor 10B in the low threshold state, and the pass transistor 20 is put into an on state. On the other hand, Vss (0 V) is applied to the gate electrodes of the pass transistors 20 of the cells $4_2$ and $4_3$ via the first memory transistor 10A in the low threshold state, and the pass transistors 20 are put into an off state. A signal that is input to the IN1 is output to the OUT1 via the pass transistor of the cell $4_1$. Signals that are input to the input signal lines IN2 and IN3 are shut off by the pass transistors 20 of the cells $4_2$ and $4_3$, respectively.

As described above, in the second embodiment; the pairs of memory transistors 10A and 10B having different threshold shift directions at the time of application of a write voltage are combined with the pass transistors 20, to form cell structures. Accordingly, writing with a FN current can be performed, and the memory transistors of the respective cells are driven through the common interconnect WL. Thus, the cell area can be made smaller.

Further, according to the second embodiment, the number of times of selective write operations can be greatly reduced. If the MUX of the second embodiment is used in a FPGA, the time necessary for programming the FPGA can be made much shorter. The number of selective writing times necessary for programming an n-input 1-output MUX is one in a case where nonvolatile programmable switches of the first embodiment are used in the MUX. On the other hand, in a case where conventional nonvolatile programmable switches are used in the MUX, selective writing needs to be performed N times. Here, the threshold states of the first and second memory transistors are expressed as (0/0), (0/1), (1/0), or (1/1). For example, the state (0/1) means that the threshold of the first memory transistor is in the "0" state, and the threshold of the second memory transistor is in the "1" state.

In the MUX of the second embodiment, when the second write voltage Vprg2 (−18 V) is applied to the common interconnect WL in the initializing operation, all the cells $4_1$, $4_2$, and $4_3$ are collectively programmed to be in the state (0/1). Accordingly, all the pass transistors 20 are put into an off state when the MUX operation (the FPGA operation) is performed. In the selective writing operation, writing should be performed so that only one selected cell is put into the state (1/0). As a result, only the pass transistor 20 of the selected cell is turned on.

As for conventional nonvolatile programmable switches, all the nonvolatile programmable switches are reset to the state (0/0) in the initializing operation (an erasing operation). In the state (0/0), the states of the pass transistors become unstable, and are not used while the nonvolatile programmable switches are operated. In the selective writing operation, writing needs to be performed on all the cells, to write the state (1/0) or the state (0/1) into all the cells.

That is, in the MUX of the second embodiment, the states of the nonvolatile memory transistor pairs in the cells are only (0/1) and (1/0). By taking advantage of the fact that the state (0/0) and the state (1/1) are unnecessary for FPGA operation, nonvolatile memory transistors that have different threshold shift directions at the time of write voltage application are combined to form pairs. In this manner, the write time in a FPGA can be made much shorter.

(Third Embodiment)

Figure 14:
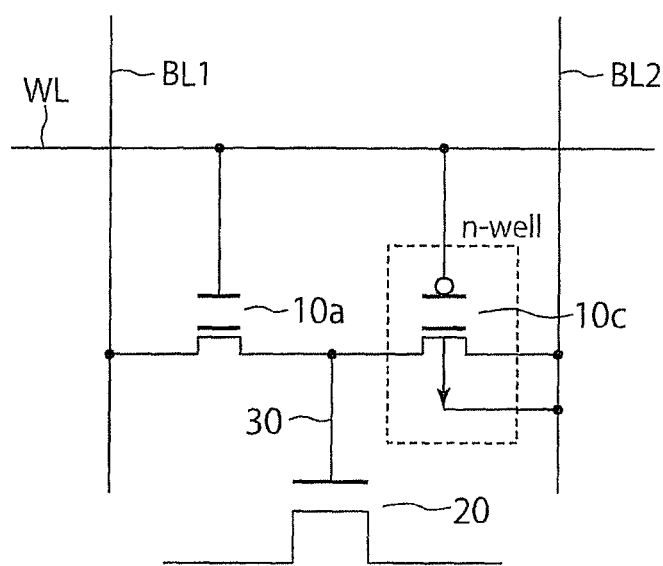
FIG. 14 is a circuit diagram showing a cell according to a third embodiment.

FIG. 14 shows a nonvolatile programmable switch (hereinafter also referred to as the switch or the cell) according to a third embodiment. The cell 4B of the third embodiment is the same as the cell 4A of the first specific example of the first embodiment shown in FIG. 9, except that the n-channel memory transistor 10b as the second memory transistor is replaced with a p-channel memory transistor 10c.

Figure 15:
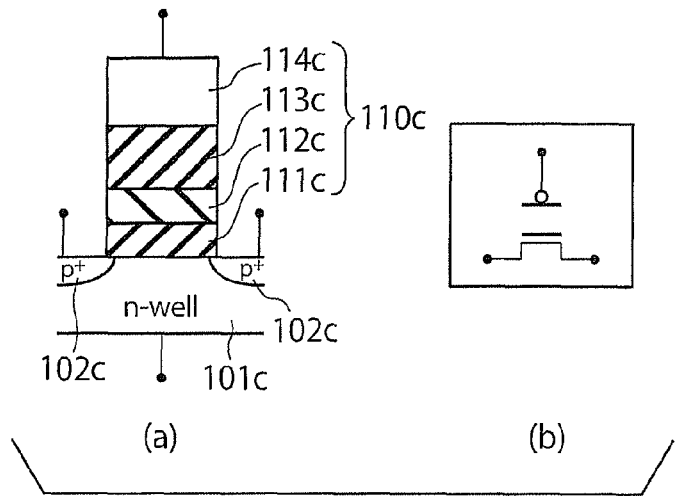
FIGS. 15(a) and 15(b) are diagrams showing a p-channel memory transistor.

FIG. 15(a) shows the structure of the memory transistor 10c. As shown in FIG. 15(a), the memory transistor 10c is a p-channel transistor formed on an n-type semiconductor region (an n-well, for example) 101c, and includes p-type source/drain regions 102c formed at a distance from each other in the n-well 101c, and a gate structure 110c formed on the region (the channel) of the n-well 101c located between the source/drain regions 102c. The n-type semiconductor region can be an n-type semiconductor substrate, instead of an n-well. The gate structure 110c has a structure formed by stacking an insulating film 111c, a charge storage film 112c, an insulating film 113c, and a gate electrode 114c in this order. One of the source/drain regions 102c is connected to the interconnect BL2 shown in FIG. 14, and the other one is connected to the interconnect 30. The gate electrode 114c is connected to the interconnect WL. The film thickness of the insulating film 111c is smaller than the film thickness of the insulating film 113c, or the mean relative permittivity of the insulating film 111c is lower than the mean relative permittivity of the insulating film 113c. In this specification, the memory transistor 10c is represented by the symbol shown in FIG. 15(b).

In the memory transistor 10c, the insulating film 111c is a stack structure $SiO_2$ (2.5 nm)/SiN (1 nm)/$SiO_2$ (2.5 nm), the charge storage film 112c is SiN (5 nm), and the insulating film 113c is a stack structure $SiO_2$ (3.5 nm)/SiN (3.5 nm)/$SiO_2$ (3.5 nm), for example. Accordingly, the film thickness of the insulating film 111c is 6 nm, the film thickness of the insulating film 113c is 10.5 nm, and the film thickness of the insulating film 111c is smaller than the film thickness of the insulating film 113c. Since the relative permittivity of $SiO_2$ is 3.9 while the relative permittivity of SiN is 8, the mean relative permittivity of the insulating film 111c is 4.26, and the mean relative permittivity of the insulating film 113c is 4.70. That is, the mean relative permittivity of the insulating film 111c is lower than the mean relative permittivity of the insulating film 113c.

The memory transistor 10c is a MONOS nonvolatile memory transistor in which the charge storage film 112c is a trapping insulating film that traps charges. Instead of the trapping insulating film, polysilicon, polysilicon doped with n-type impurities, or polysilicon doped with p-type impurities can be used. In that case, the memory transistor 10c becomes a nonvolatile memory transistor of a floating gate type. Also, the charge storage film 112c can be a stack structure formed with polysilicon and a SiN film. Further, the charge storage film 112c can include a layer containing fine particles (dots) made of a metal or a semiconductor.

In the memory transistor 10c, the insulating film 113c has the stack structure $SiO_2$ (3.5 nm)/SiN (3.5 nm)/$SiO_2$ (3.5 nm). Instead of this stack structure, a material with a high relative permittivity can be used. The material with a high relative permittivity can be an Hf oxide, a Zr oxide, a Ta oxide, a Ti oxide, a La oxide, an Al oxide, a mixture of those oxides, LaAlO, or the like.

In the memory transistor 10c, it is important that the insulating film 113c blocks electrons from passing therethrough (blocking performance). Therefore, a film stack formed with low-χ material layer/high-χ material layer/low-χ material layer can be used, as in the first embodiment. It is also possible to use a stack structure in which an Hf oxide, a Zr oxide, a Ta oxide, a Ti oxide, a La oxide, an Al oxide, a mixture of those oxides, or LaAlO is interposed between $SiO_2$ layers or SiN layers.

Figure 16:
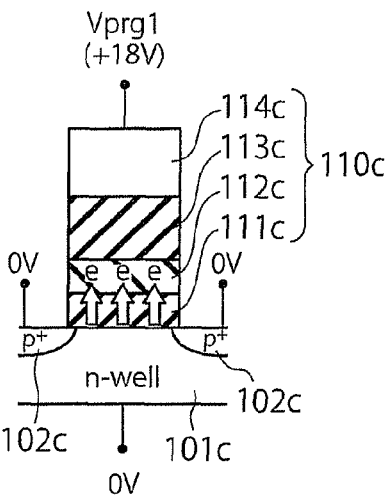
FIGS. 16(a) and 16(b) are diagrams showing write voltages in the p-channel memory transistor.
Figure 16:
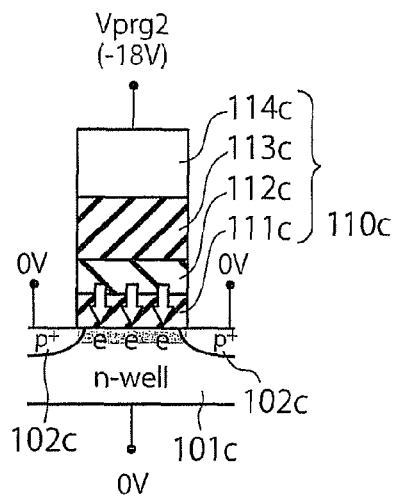

FIGS. 16(a) and 16(b) show write voltages in the memory transistor 10c. In the memory transistor 10c, the first write voltage Vprg1 is +18 V, and the second write voltage Vprg2 is −18 V, for example. As shown in FIG. 16(a), in a case where the voltage applied to the source/drain regions 102c and the n-well 101c is 0 V, and the first write voltage Vprg1 (+18 V) is applied to the gate electrode 114c, in the memory transistor 10c, electrons in the channel pass through the insulating film 111c by virtue of a tunneling phenomenon, are injected into the charge storage film 112c, and are trapped and stored in the charge storage film 112c. Since the mean relative permittivity of the insulating film 113c is higher than the mean relative permittivity of the insulating film 111c, no electrons move from the charge storage film 112c to the gate electrode 114c. The negative charges (electrons) stored in the charge storage film 112c cause the threshold voltage ($V_{th}$) of the p-channel memory transistor 10c to shift in the positive direction. This is equivalent to lowering the threshold voltage of the p-channel memory transistor 10c. This lowered threshold is +2 V, for example. Here, for the p-channel memory transistor 10c, the terms of high threshold and low threshold is defined as follows. The threshold is higher when the absolute value of the threshold $V_{th}$ is greater in a case where the threshold $V_{th}$ is negative, and the threshold is higher when the absolute value of the threshold $V_{th}$ is smaller in a case where the threshold $V_{th}$ is positive. Meanwhile, for the p-channel memory transistor 10c, the threshold is lower when the absolute value of the threshold $V_{th}$ is smaller in a case where the threshold $V_{th}$ is negative, and the threshold is lower when the absolute value of the threshold $V_{th}$ is greater in a case where the threshold $V_{th}$ is positive.

As shown in FIG. 16(b), in a case where the voltage applied to the source/drain regions 102c and the n-well 101c is 0 V, and the second write voltage Vprg2 (−18 V) is applied to the gate electrode 114c while the memory transistor 10c is in a low threshold state, electrons stored in the charge storage film 112c pass through the insulating film 111c by virtue of a tunneling phenomenon, and are released into the channel. Since the mean relative permittivity of the insulating film 113c is higher than the mean relative permittivity of the insulating film 111c, no electrons move from the gate electrode 114c to the charge storage film 112c. In the memory transistor 10c, the threshold returns to the original high threshold. This high threshold is −2 V, for example. If the second write voltage Vprg2 is applied to the memory transistor 10c in a state where no charges are stored in the charge storage film 112c (a high threshold state), no charges are transferred, and the high threshold state is maintained.

Figure 17:
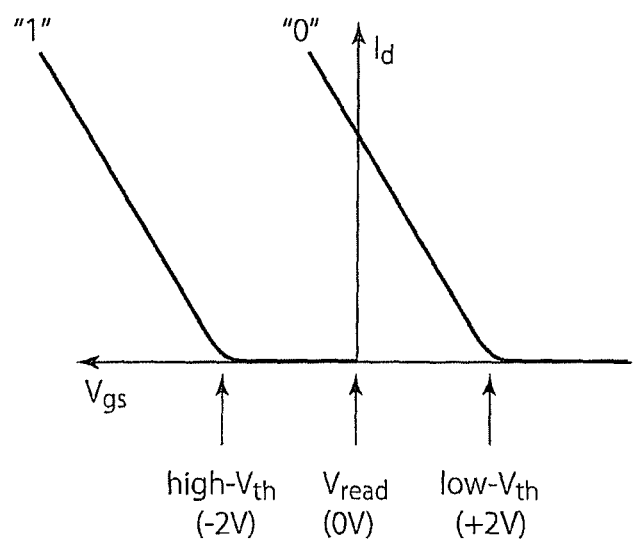
FIG. 17 is a graph showing the $I_d$-$V_{gs}$ characteristics of the p-channel memory transistor.

FIG. 17 shows the drain current ($I_d$)-gate voltage ($V_{gs}$) characteristics in a case where the memory transistor 10c is in a high threshold state and in a case where the memory transistor 10c is in a low threshold state.

In the cell 4B of the third embodiment shown in FIG. 14, when the first write voltage Vprg1 (+18 V) is applied to the interconnect WL, the threshold voltage of the n-channel memory transistor 10a can be made higher by writing with a FN tunneling current, and the threshold voltage of the p-channel memory transistor 10c can be made lower by the writing. When the second write voltage Vprg2 (−18 V) is applied to the interconnect WL, the threshold voltage of the n-channel memory transistor 10a can be made lower, and the threshold voltage of the p-channel memory transistor 10c can be made higher. That is, in a FPGA operation of the cell 4B, one of the n-channel memory transistor 10a and the p-channel memory transistor 10c is put into an on state, and the other one is put into an off state. Also, in a writing operation, the amounts of threshold changes $\Delta V_{th}$ of the n-channel memory transistor 10a and the p-channel memory transistor 10c can be controlled independently of each other.

(First Modification)

Figure 18:
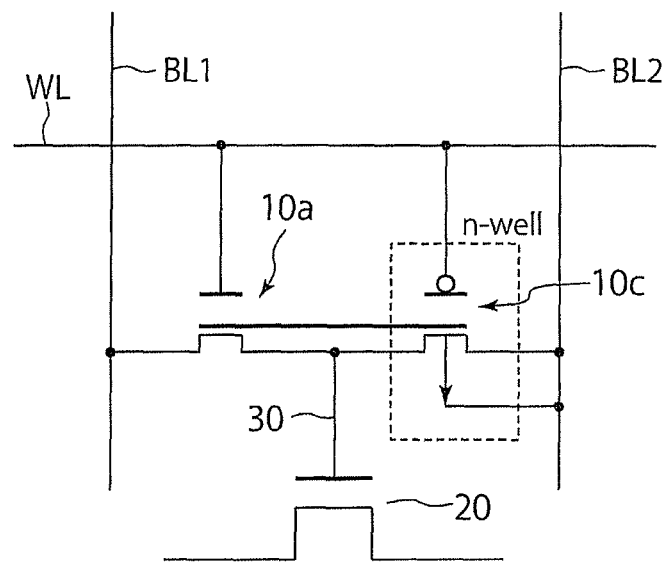
FIG. 18 is a circuit diagram showing a cell according to a first modification of the third embodiment.

FIG. 18 shows a cell 4C according to a first modification of the third embodiment. The cell 4C according to the first modification is the same as the cell 4B of the third embodiment shown in FIG. 14, except that the charge storage film 112a of the n-channel memory transistor 10a is connected to the charge storage film 112c of the p-channel memory transistor 10c. For example, the charge storage film 112a of the n-channel memory transistor 10a and the charge storage film 112c of the p-channel memory transistor 10c are one charge storage film. In the cell 4C according to the first modification, it is not necessary to perform the process to divide a charge storage film made of SiN into the charge storage film 112a of the n-channel memory transistor 10a and the charge storage film 112c of the p-channel memory transistor 10c. This facilitates manufacture of particularly small cells.

In the cell 4C of the first modification, both the n-channel memory transistor 10a and the p-channel memory transistor 10c are MONOS memory transistors. While the cell 4C of the first modification is operated, one of the n-channel memory transistor 10a and the p-channel memory transistor 10c is in an on state, and the other one is in an off state, as in the cell 4B of the third embodiment shown in FIG. 14. In writing operations, the amounts of threshold changes $\Delta V_{th}$ of the n-channel memory transistor 10a and the p-channel memory transistor 10c can be controlled independently of each other.

On the other hand, a cell for a comparative example is formed, and this cell is the same as the cell 4C of the first modification, except that the n-channel memory transistor 10a and the p-channel memory transistor 10c are FG memory transistors.

In the cell of this comparative example, the amounts of threshold changes $\Delta V_{th}$ of the n-channel memory transistor 10a and the p-channel memory transistor 10c cannot be controlled independently of each other. That is, when the threshold of one of the memory transistors is changed, the threshold of the other one of the memory transistors follows and changes. Therefore, in writing operations in this comparative example cell, the read voltage $V_{read}$ cannot be set so as to turn on one of the memory transistors and turn off the other one of the memory transistors in some cases.

In this comparative example cell, if the shared FG (the charge storage film) is divided between the n-channel memory transistor and the p-channel memory transistor, the amounts of threshold changes $\Delta V_{th}$ can be controlled independently of each other by adjusting the impurity concentration in the channel and the impurity concentration in the gate electrode. In that case, however, a process margin (or space) for the dividing is needed since the FG (the charge storage film) is thick. Namely, the necessary cell area is made larger. In a typical example, the thicknesses of the tunneling film, the charge storage film (FG), and the blocking film of a FG memory transistor are 7 nm, 90 nm, 9 nm, respectively, and the total thickness is 106 nm.

In the MONOS memory transistors used in the cell 4B of the third embodiment and the cell 4C of the first modification of the third embodiment, the charge storage film made of SiN is thin, and therefore, the process margin for the dividing is small. The thicknesses of the tunneling film, the charge storage film, and the blocking film in a MONOS memory transistor in the cell of the third embodiment are 6 nm, 5 nm, and 10.5 nm, for example, and the total thickness is 21.5 nm.

Even if a charge storage film made of SiN is shared between an n-channel memory transistor and a p-channel memory transistor in a MONOS memory transistor, as in the first modification, the amounts of threshold changes $\Delta V_{th}$ can be controlled independently of each other. This is because electrons injected into and trapped in the charge storage film made of SiN are immobilized/localized, while electrons injected into a FG as in the comparative example become mobile carriers and are rearranged so that the potential in the FG becomes uniform. Where a charge storage film made of SiN is shared, a high process cost and a large cell area for the dividing are not necessary. Accordingly, the amounts of threshold changes $\Delta V_{th}$ of the n-channel memory transistor and the p-channel memory transistor can be controlled independently of each other.

A case where the charge storage film of the MONOS memory transistors used in the cell 4C of the first modification of the third embodiment is made of SiN is now described. In this case, the composition ratio x in the SiNx film forming the charge storage film is preferably within the range expressed as $0.67 < x \leq 1.33$. The stoichiometric composition of the SiNx film is $Si_3N_4$, and the molar ratio of N to Si is x=1.33. The SiNx film with the composition ratio x lower than 1.33 has a Si-rich composition with a high Si composition ratio, and the amount of electrons trapped due to dangling bonds of Si becomes larger. Accordingly, a larger threshold change $\Delta V_{th}$ can be realized. Where x is 0.67, two of the four bonds of Si normally become dangling bonds, which is equivalent to a composition forming covalent bonds with adjacent Si. In that case, a large amount of covalent bonds exist, and the trapped electrons are diffused over a wide range. As a result, it becomes difficult to control the amounts of threshold changes $\Delta V_{th}$ of the n-channel memory transistor and the p-channel memory transistor independently of each other.

As the cells 4 forming the MUX of the second embodiment, the cell 4A of the first specific example of the first embodiment, the cell 4B of the third embodiment, or the cell 4C of the first modification of the third embodiment can be used to form the MUX. In that case, the initializing, selective writing, and FPGA operations can be performed in the same manner as in the MUX of the second embodiment. In a case where the cell 4B of the third embodiment is used, for example, the FPGA operation is performed by applying the read voltage $V_{read}$ (+2 V) to the interconnect WL. The source-gate voltage $V_{gs}$ of the n-channel memory transistor 10a as the first memory transistor is determined by $V_{read} - Vss$, and therefore $V_{gs}$ is +2 V. Here, Vss is the voltage applied to the source, and is 0 V (see FIG. 13). Meanwhile, the source-gate voltage $V_{gs}$ of the p-channel memory transistor 10c as the second memory transistor is equal to $V_{read} - Vdd$, and therefore, $V_g$, is 0 V. Here, Vdd is the voltage applied to the source of the p-channel memory transistor 10c (+2 V, for example (see FIG. 13)). Therefore, as is apparent from FIGS. 8 and 17, the n-channel memory transistor 10a and the p-channel memory transistor 10c are put into an on state or an off state, depending on whether the threshold voltages of the n-channel memory transistor 10a and the p-channel memory transistor 10c are high or low.

The cell 4B of the third embodiment and the cell 4C of the first modification of the third embodiment have two advantages over the cell 4A of the first specific example of the first embodiment. A first advantage is that in the third embodiment, the gate stack structures of the first memory transistor 10a and the second memory transistor 10c can be made the same, and the number of procedures for manufacturing the gate unit can be reduced. A second advantage is that in the third embodiment, the n-channel memory transistor 10a can be used as the first memory transistor for transferring Vss in FPGA operations, and the p-channel memory transistor 10c can be used as the second memory transistor for transferring Vdd. Normally, an n-channel memory transistor is more advantageous for transferring Vss, and a p-channel memory transistor is more advantageous for transferring Vdd. This is because a Vdd transfer by an n-channel memory transistor is accompanied by a voltage drop equivalent to the threshold voltage.

As described above, according to the third embodiment and the first modification thereof, writing with a FN current can be performed, and the two memory transistors are driven through the common interconnect WL, as in the first embodiment. Accordingly, the cell area can be made smaller.

(Fourth Embodiment)

Figure 19:
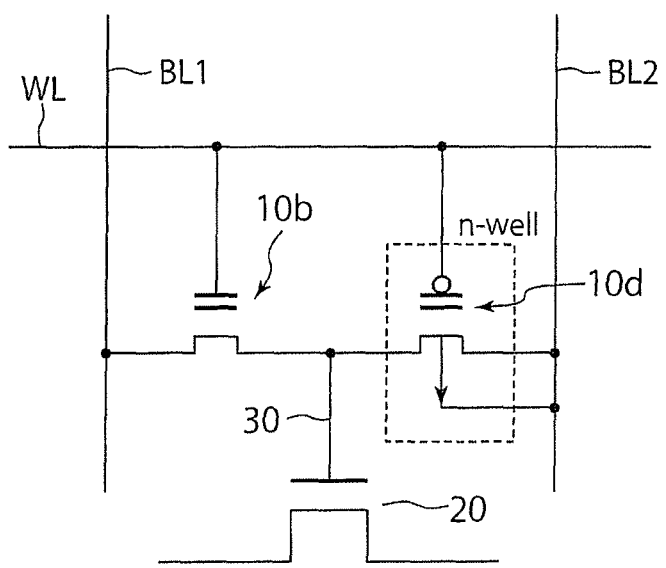
FIG. 19 is a circuit diagram showing a cell according to a fourth embodiment.

FIG. 19 shows a nonvolatile programmable switch (hereinafter also referred to as the cell 4D) according to a fourth embodiment. The cell 4D of the fourth embodiment is the same as the cell 4B of the third embodiment shown in FIG. 14, except that the n-channel memory transistor 10a as the first memory transistor is replaced with the n-channel memory transistor 10b shown in FIG. 6(a), and the p-channel memory transistor 10c as the second memory transistor is replaced with a p-channel memory transistor 10d.

In the n-channel memory transistor 10d in the cell 4D, one of a source and a drain is connected to the interconnect BL1, and the other one is connected to the interconnect 30, and a gate electrode is connected to the interconnect WL.

Figure 20:
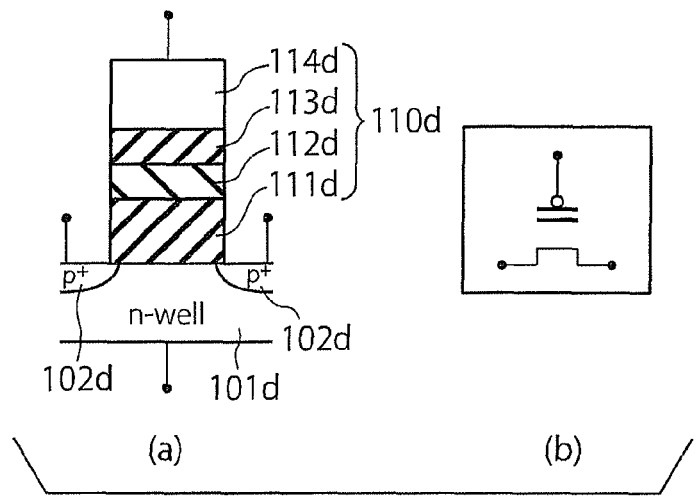
FIGS. 20(a) and 20(b) are diagrams showing a p-channel memory transistor.

FIG. 20(a) shows the structure of the p-channel memory transistor 10d. As shown in FIG. 20(a), the memory transistor 10d is a p-channel transistor formed on an n-type semiconductor region (an n-well, for example) 101d, and includes p-type source/drain regions 102d formed at a distance from each other in the n-well 101d, and a gate structure 110d formed on the region (the channel) of the n-well 101d located between the source/drain regions 102d. The n-type semiconductor region can be an n-type semiconductor substrate, instead of an n-well. The gate structure 110d has a structure formed by stacking an insulating film 111d, a charge storage film 112d, an insulating film 113d, and a gate electrode 114d in this order. One of the source/drain regions 102d is connected to the interconnect BL2 shown in FIG. 19, and the other one is connected to the interconnect 30. The gate electrode 114d is connected to the interconnect WL. The film thickness of the insulating film 111d is greater than the film thickness of the insulating film 113d, or the mean relative permittivity of the insulating film 111d is higher than the mean relative permittivity of the insulating film 113d. In this specification, the memory transistor 10d is represented by the symbol shown in FIG. 20(b).

In the memory transistor 10d, the insulating film 111d is a stack structure $SiO_2$ (3.5 nm)/SiN (3.5 nm)/$SiO_2$ (3.5 nm), the charge storage film 112d is SiN (5 nm), and the insulating film 113d is a stack structure $SiO_2$ (2.5 nm)/SiN (1 nm)/$SiO_2$ (2.5 nm), for example. Accordingly, the film thickness of the insulating film 111d is 10.5 nm, the film thickness of the insulating film 113d is 6 nm, and the film thickness of the insulating film 111d is greater than the film thickness of the insulating film 113d. Since the relative permittivity of $SiO_2$ is 3.9 while the relative permittivity of SiN is 8, the mean relative permittivity of the insulating film 111d is 4.70, and the mean relative permittivity of the insulating film 113d is 4.26. That is, the mean relative permittivity of the insulating film 111d is higher than the mean relative permittivity of the insulating film 113d.

The memory transistor 10d is a MONOS nonvolatile memory transistor in which the charge storage film 112d is a trapping insulating film that traps charges. Instead of the trapping insulating film, polysilicon, polysilicon doped with n-type impurities, or polysilicon doped with p-type impurities can be used. In that case, the memory transistor 10d becomes a nonvolatile memory transistor of a floating gate type. Also, the charge storage film 112d can be a stack structure formed with polysilicon and a SiN film. Further, the charge storage film 112d can include a layer containing fine particles (dots) made of a metal or a semiconductor.

In the memory transistor 10d, the insulating film 111d has the stack structure SiO$_2$ (3.5 nm)/SiN (3.5 nm)/SiO$_2$ (3.5 nm). Instead of this stack structure, a material with a high relative permittivity can be used. The material with a high relative permittivity can be an Hf oxide, a Zr oxide, a Ta oxide, a Ti oxide, a La oxide, an Al oxide, a mixture of those oxides, LaAlO, or the like.

In the memory transistor 10d, it is important that the insulating film 111d blocks electrons from passing therethrough (blocking performance). Therefore, a film stack formed with low-$\chi$ material layer/high-$\chi$ material layer/low-$\chi$ material layer can be used, as in the first embodiment. It is also possible to use a stack structure in which an Hf oxide, a Zr oxide, a Ta oxide, a Ti oxide, a La oxide, an Al oxide, a mixture of those oxides, or LaAlO is interposed between SiO$_2$ layers or SiN layers.

Figure 21:
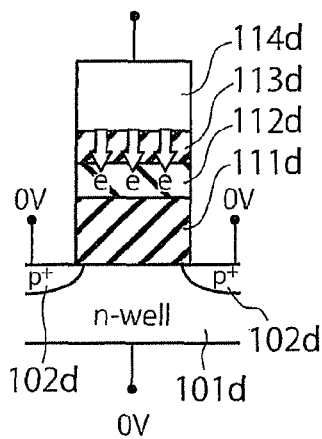
FIGS. 21(a) and 21(b) are diagrams showing write voltages in the p-channel memory transistor.
Figure 21:
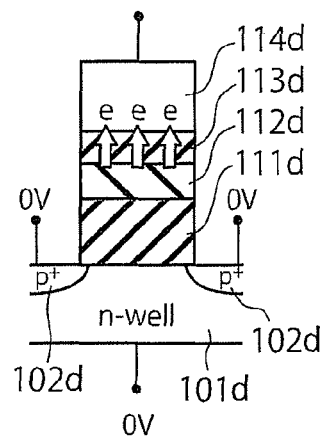

FIGS. 21(a) and 21(b) show write voltages in the memory transistor 10d. As shown in FIG. 21(a), in a case where the voltage applied to the source/drain regions 102d and the n-well 101d is 0 V, and the second write voltage Vprg2 (−18 V) is applied to the gate electrode 114d in the memory transistor 10d, electrons in the gate electrode 114d pass through the insulating film 113d by virtue of a tunneling phenomenon, are injected into the charge storage film 112d, and are trapped and stored in the charge storage film 112d. Since the mean relative permittivity of the insulating film 111d is higher than the mean relative permittivity of the insulating film 113d, no electrons move from the charge storage film 112d to the channel. The negative charges stored in the charge storage film 112d cause the threshold voltage ($V_{th}$) of the p-channel memory transistor 10d to drop to a low threshold. This low threshold is +2 V, for example.

As shown in FIG. 21(b), in a case where the voltage applied to the source/drain regions 102d and the n-well 101d is 0 V, and the first write voltage Vprg1 (+18 V) is applied to the gate electrode 114d while the memory transistor 10d is in a low threshold state, negative charges (electrons) stored in the charge storage film 112d pass through the insulating film 113d by virtue of a tunneling phenomenon, and are released into the gate electrode 114d. Since the mean relative permittivity of the insulating film 111d is higher than the mean relative permittivity of the insulating film 113d, no electrons move from the channel to the charge storage film 112d. As the charge storage film 112d returns to the original neutral state, the threshold of the p-channel memory transistor 10d returns to the original high threshold. This high threshold is −2 V, for example. If the first write voltage Vprg1 is applied to the memory transistor 10d in a state where no charges are stored in the charge storage film 112d (a high threshold state), no charges are transferred, and the high threshold state is maintained.

Figure 22:
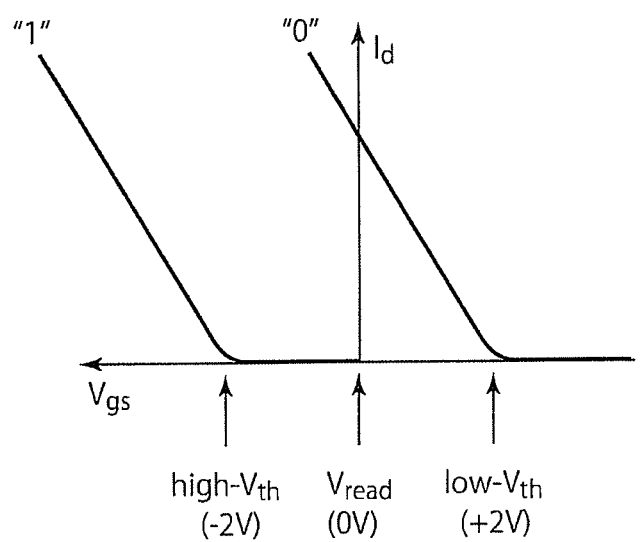
FIG. 22 is a graph showing the $I_d$-$V_{gs}$ characteristics of the p-channel memory transistor.

FIG. 22 shows the drain current ($I_d$)-gate voltage ($V_{gs}$) characteristics in a case where the memory transistor 10d is in a high threshold state and in a case where the memory transistor 10d is in a low threshold state.

In the cell 4D of the fourth embodiment shown in FIG. 19, when the first write voltage Vprg1 (+18 V) is applied to the interconnect WL, the threshold voltage of the n-channel memory transistor 10b can be made lower by writing with a FN tunneling current, and the threshold voltage of the p-channel memory transistor 10d can be made higher by the writing. When the second write voltage Vprg2 (−18 V) is applied to the interconnect WL, the threshold voltage of the n-channel memory transistor 10b can be made higher, and the threshold voltage of the p-channel memory transistor 10d can be made lower.

(First Modification)

Figure 23:
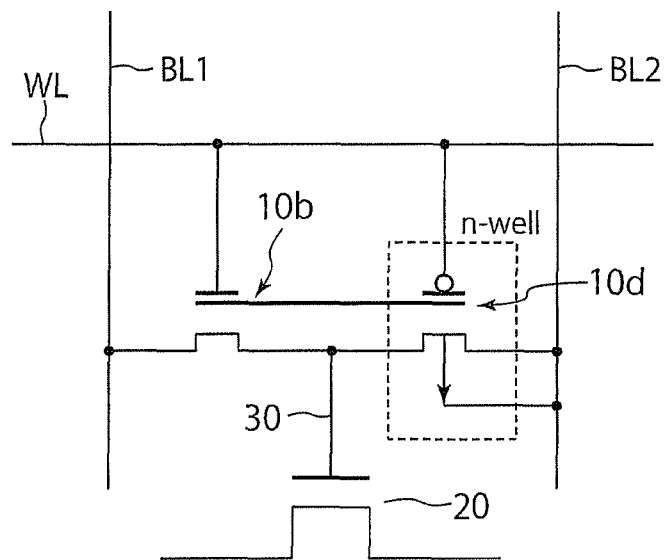
FIG. 23 is a circuit diagram showing a cell according to a first modification of the fourth embodiment.

FIG. 23 shows a cell 4E according to a first modification of the fourth embodiment. The cell 4E is the same as the cell 4D of the fourth embodiment shown in FIG. 19, except that the charge storage film 112b of the n-channel memory transistor 10b is connected to the charge storage film 112d of the p-channel memory transistor 10d. For example, a charge storage film can be shared between the n-channel memory transistor 10b and the p-channel memory transistor 10d. In the cell 4E according to the first modification, it is not necessary to perform the process to divide a charge storage film. This facilitates manufacture of particularly small cells.

In the cell 4E of the first modification, the n-channel memory transistor 10b and the p-channel memory transistor 10d are MONOS memory transistors. While the cell 4E of the first modification is operated, one of the n-channel memory transistor 10b and the p-channel memory transistor 10d is in an on state, and the other one is in an off state, as in the cell 4B of the third embodiment shown in FIG. 14. In writing operations, the amounts of threshold changes $\Delta V_{th}$ of the n-channel memory transistor 10b and the p-channel memory transistor 10d can be controlled independently of each other.

The cell 4D according to the fourth embodiment or the cell 4E according to the modification of the fourth embodiment can be used as the cells forming the MUX of the second embodiment. In that case, the initializing, selective writing, and FPGA operations can be performed in the same manner as in the second embodiment, except for the followings. Where the cell 4D according to the fourth embodiment or the cell 4E according to the modification of the fourth embodiment is used, the first write voltage Vprg1 (+18 V) is applied to the interconnect WL at the time of initializing, and the second write voltage Vprg2 (−18 V) is applied to the interconnect WL at the time of selective writing.

The advantages of the fourth embodiment over the first embodiment are the same as the above described advantages of the third embodiment over the first embodiment. An advantage of the fourth embodiment over the third embodiment is that the charge injection efficiency can become higher. This is because the threshold change $\Delta V_{th}$ of the p-type transistor depends not on the electron exchange between the channel and the charge storage film, or but on the electron exchange between the gate electrode and the charge storage film.

As described above, according to the fourth embodiment and the first modification thereof, writing with a FN current can be performed, and the two memory transistors are driven through the common interconnect WL, as in the first embodiment. Accordingly, the cell area can be made smaller.

(Fifth Embodiment)

Figure 24:
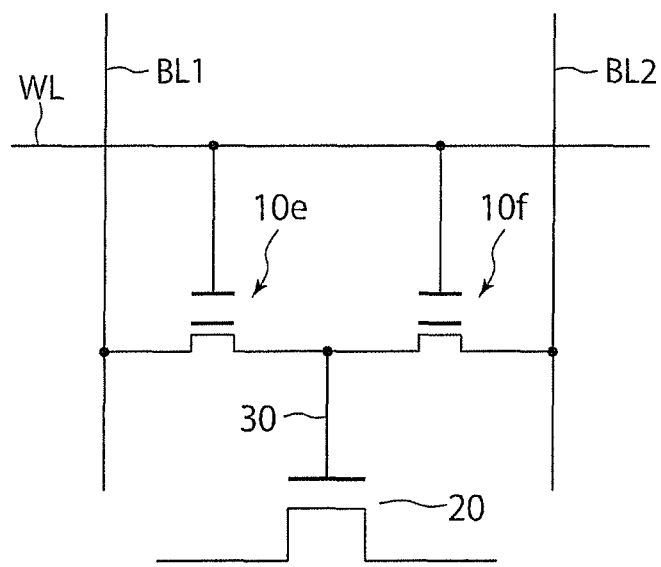
FIG. 24 is a circuit diagram showing a cell according to a fifth embodiment.

FIG. 24 shows a nonvolatile programmable switch (hereinafter also referred to as the cell 4F) according to a fifth embodiment. The cell 4F according to the fifth embodiment is the same as the cell 4A of the first specific example of the first embodiment shown in FIG. 9, except that the n-channel memory transistors 10a and 10b are replaced with n-channel memory transistors 10e and 10f, respectively. In the memory transistor 10e, one of a source and a drain is connected to the interconnect BL1, the other one of the source and the drain is connected to the interconnect 30, and a gate electrode is connected to the interconnect WL. In the memory transistor 10*f*, one of a source and a drain is connected to the interconnect BL2, the other one of the source and the drain is connected to the interconnect 30, and a gate electrode is connected to the interconnect WL.

Figure 25:
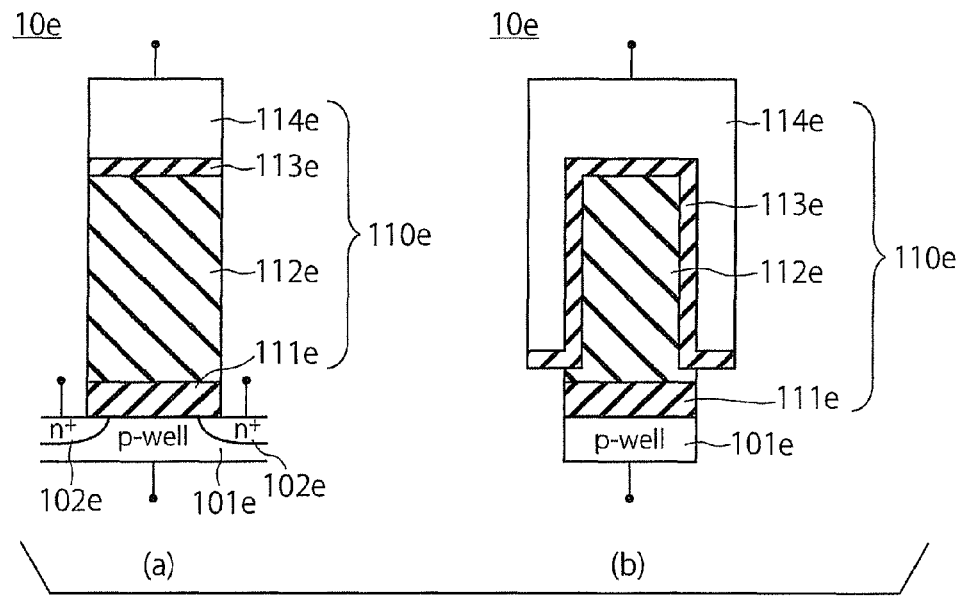
FIGS. 25(a) and 25(b) are cross-sectional views showing an n-channel memory transistor.

FIGS. 25(*a*) and 25(*b*) show the structure of the n-channel memory transistor 10*e*. FIG. 25(*a*) is a cross-sectional view taken in the gate length direction (the direction from the source to the drain). FIG. 25(*b*) is a cross-sectional view taken in a direction perpendicular to the gate length direction. As shown in FIG. 25(*a*), this memory transistor 10*e* is an n-channel transistor formed on a p-type semiconductor region (a p-well, for example) 101*e*, and includes n-type source/drain regions 102*e* formed at a distance from each other in the p-well 101*e*, and a gate structure 110*e* formed on the region (the channel) of the p-well 101*e* located between the source/drain regions 102*e*. The p-type semiconductor region can be a p-type semiconductor substrate, instead of a p-well. The gate structure 110*e* has a structure formed by stacking an insulating film (a tunneling film) 111*e*, a charge storage film 112*e*, an insulating film (a blocking film) 113*e*, and a gate electrode 114*e* in this order. As shown in FIG. 25(*b*), the insulating film 113*e* is formed so as to cover the upper face and part of the side faces of the charge storage film 112*e*, and the gate electrode 114*e* is formed so as to cover the upper face and the side faces of the insulating film 113*e*.

Figure 26:
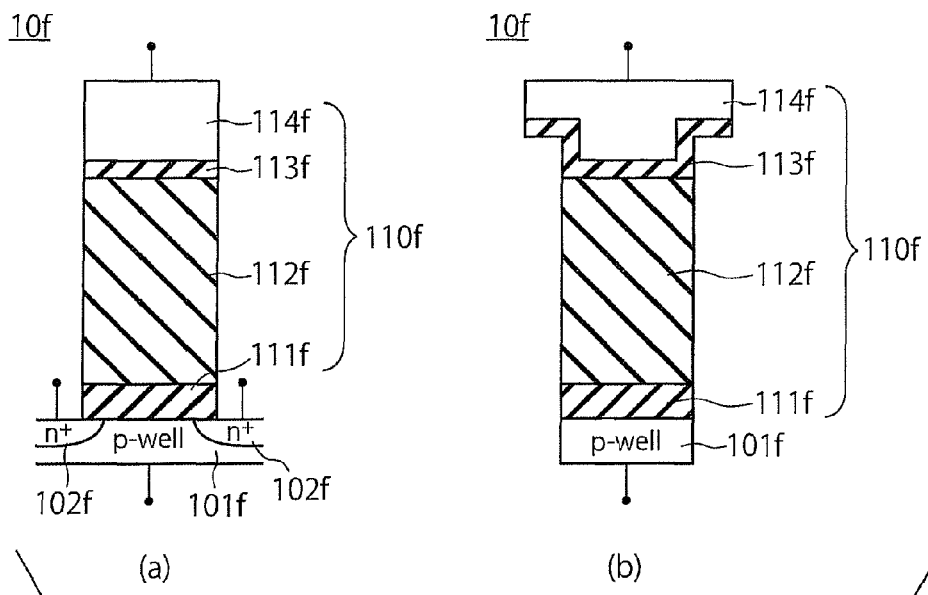
FIGS. 26(a) and 26(b) are cross-sectional views showing an n-channel memory transistor.

FIGS. 26(*a*) and 26(*b*) show the structure of the n-channel memory transistor 10*f*. FIG. 26(*a*) is a cross-sectional view taken in the gate length direction (the direction from the source to the drain). FIG. 26(*b*) is a cross-sectional view taken in a direction perpendicular to the gate length direction. As shown in FIG. 26(*a*), this memory transistor 10*f* is an n-channel transistor formed on a p-type semiconductor region (a p-well, for example) 101*f*, and includes n-type source/drain regions 102*f* formed at a distance from each other in the p-well 101*f*, and a gate structure 110*f* formed on the region (the channel) of the p-well 101*f* located between the source/drain regions 102*f*. The p-type semiconductor region can be a p-type semiconductor substrate, instead of a p-well. The gate structure 110*f* has a structure formed by stacking an insulating film (a tunneling film) 111*f*, a charge storage film 112*f*, an insulating film (a blocking film) 113*f*, and a gate electrode 114*f* in this order. As shown in FIG. 26(*b*), the insulating film 113*f* is designed so that the area in contact with the gate electrode 114*f* is larger than the area in contact with the charge storage film 112*f*. Also, as shown in FIG. 26(*b*), the insulating film 113*f* is designed so that the area of the lower face of the insulating film 113*f* is larger than the area of the upper face of the charge storage film 112*f*, and the area of the upper face of the insulating film 113*f* is not larger than the area of the lower face of the gate electrode 114*f*. The memory transistors 10*e* and 10*f* can be either MONOS nonvolatile memory transistors or FG nonvolatile memory transistors.

In the fifth embodiment, the facing area (the overlapped area) of the gate electrode 114*e* with respect to the charge storage film 112*e* of the memory transistor 10*e*, with the insulating film 113*e* being interposed in between, is larger than the facing area (the overlapped area) of the gate electrode 114*f* with respect to the charge storage film 112*f* of the memory transistor 10*f*, with the insulating film 113*f* being interposed in between. The difference in facing area between gate electrodes with respect to charge storage films causes a difference in potential between the charge storage films seen from the well (substrate) when a voltage is applied to the gate electrodes. As the facing area is larger, the potential of the charge storage film becomes higher. Specifically, where Vcg represents the voltage applied to the gate electrode, Vct represents the potential of the charge storage film, $C_1$ represents the capacitance between the charge storage film and the well, and $C_2$ represents the capacitance between the gate electrode and the charge storage film, the following relationship is established:

$$Vct = (C_2/(C_1+C_2)) \times Vcg$$

Therefore, the above described facing area is related to the capacitance $C_2$ in between. Here, $C_2/(C_1+C_2)$ is called a coupling ratio. If coupling ratios are different, memory operations are different even when the same voltage is applied to gate electrodes. Where S represents the facing area between two electrodes facing each other via an insulating film, t represents the thickness of the insulating film, and $\epsilon$ represents the permittivity of the insulating film, the capacitance C is expressed as:

$$C = (S/t) \times \epsilon$$

In the structure shown in FIG. 25(*b*), the facing area related to the capacitance $C_1$ is smaller than the facing area related to the capacitance $C_2$. Accordingly, the capacitance $C_2$ is large, and the charge exchange via the insulating film 111*e* can be accelerated.

In the structure shown in FIG. 26(*b*), on the other hand, a difference in the facing area S is not easily caused between the capacitance $C_1$ and the capacitance $C_2$, compared with the case of the structure shown in FIG. 25(*b*). To accelerate a charge exchange in this case, the thickness t of the insulating film needs to be changed. Therefore, to accelerate the charge exchange via the insulating film 113*f* in the structure shown in FIG. 26(*b*), the insulating film 113*f* needs to be made thinner than the insulating film 111*f*.

Figure 27:
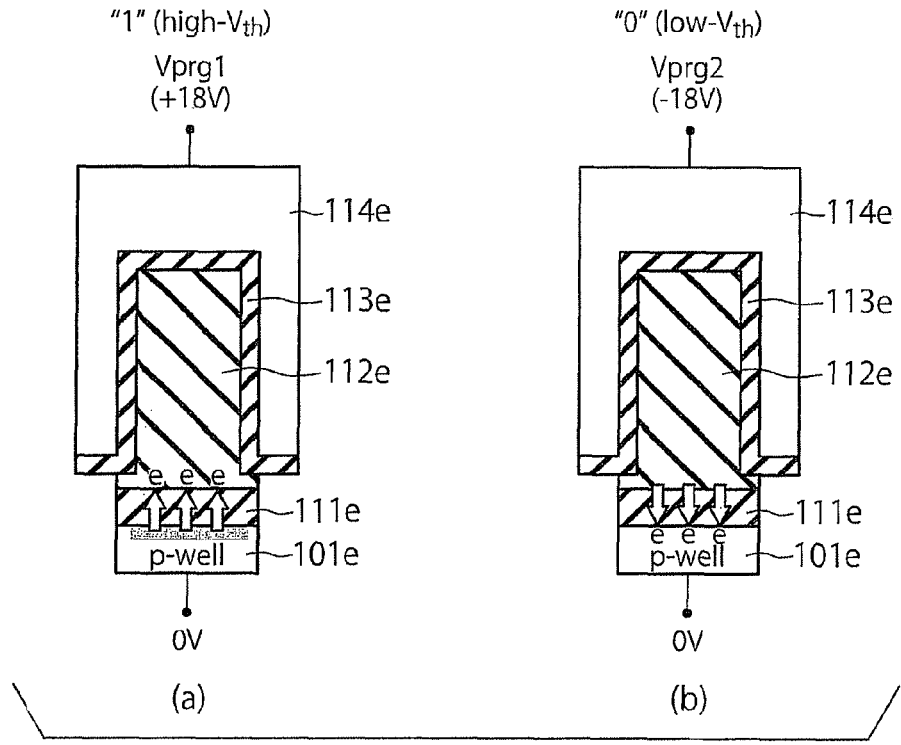
FIGS. 27(a) and 27(b) are diagrams showing write voltages in the n-channel memory transistor.

FIGS. 27(*a*) and 27(*b*) show write voltages in the memory transistor 10*e*. In the fifth embodiment, the first write voltage Vprg1 is +18 V, and the second write voltage Vprg2 is −18 V, for example. As shown in FIG. 27(*a*), in a case where the voltage applied to the source/drain regions 102*e* and the p-well 101*e* is 0 V, and the first write voltage Vprg1 (+18 V) is applied to the gate electrode 114*e* in the memory transistor 10*e*, electrons in the channel pass through the insulating film 111*e* by virtue of a tunneling phenomenon (a FN tunneling current), and are injected into the charge storage film 112*e*. The injected electrons are trapped and stored in the charge storage film 112*e*. Since the facing area of the gate electrode 114*e* with respect to the charge storage film 112*e* is larger than the facing area of the channel with respect to the charge storage film 112*e* in the memory transistor 10*e*, the amount of electrons flowing from the charge storage film 112*e* to the gate electrode 114*e* via the insulating film 113*e* is smaller than the amount of electrons injected from the channel into the charge storage film 112*e*.

The negative charges (electrons) stored in the charge storage film 112*e* increase the threshold voltage ($V_{th}$) of the n-channel memory transistor 10*e* to a high threshold. This high threshold is 4 V, for example.

As shown in FIG. 27(*b*), in a case where the voltage applied to the source/drain regions 102*e* and the p-well 101*e* is 0 V, and the second write voltage Vprg2 (−18 V) is applied to the gate electrode 114*e* while the memory transistor 10*e* is in a high threshold state, electrons stored in the charge storage film 112*e* pass through the insulating film 111*e* by virtue of a tunneling phenomenon, and are released into the channel. Since the facing area of the gate electrode with respect to the charge storage film 112*e* is larger than the facing area of the channel with respect to the charge storage film 112*e* in the memory transistor 10*e*, the amount of electrons injected from the gate electrode 114*e* into the charge storage film 112*e* is smaller than the amount of electrons flowing from the charge storage film 112e to the channel. Because of this, the charge storage film 112e returns to the original neutral state, and accordingly, the threshold of the memory transistor 10e becomes the original low threshold. This low threshold is 0 V, for example. If the second write voltage Vprg2 is applied to the memory transistor 10e in a state where no charges are stored in the charge storage film 112e (a low threshold state), no charges are transferred, and the low threshold state is maintained.

Figure 28:
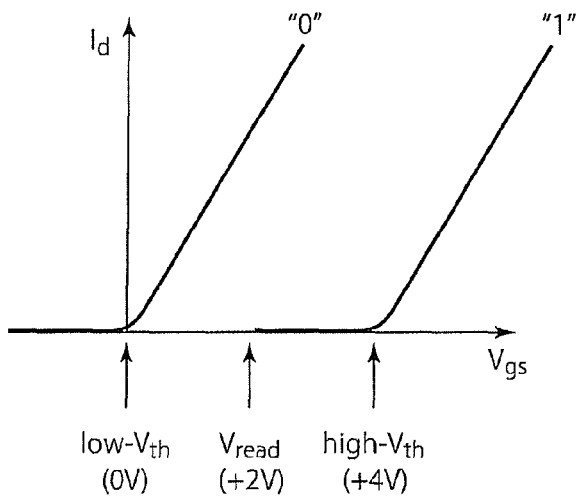
FIG. 28 is a graph showing the $I_d$-$V_{gs}$ characteristics of the n-channel memory transistor.

FIG. 28 shows the drain current ($I_d$)-gate voltage ($V_{gs}$) characteristics in a case where the memory transistor 10e is in a high threshold state and in a case where the memory transistor 10e is in a low threshold state.

Figure 29:
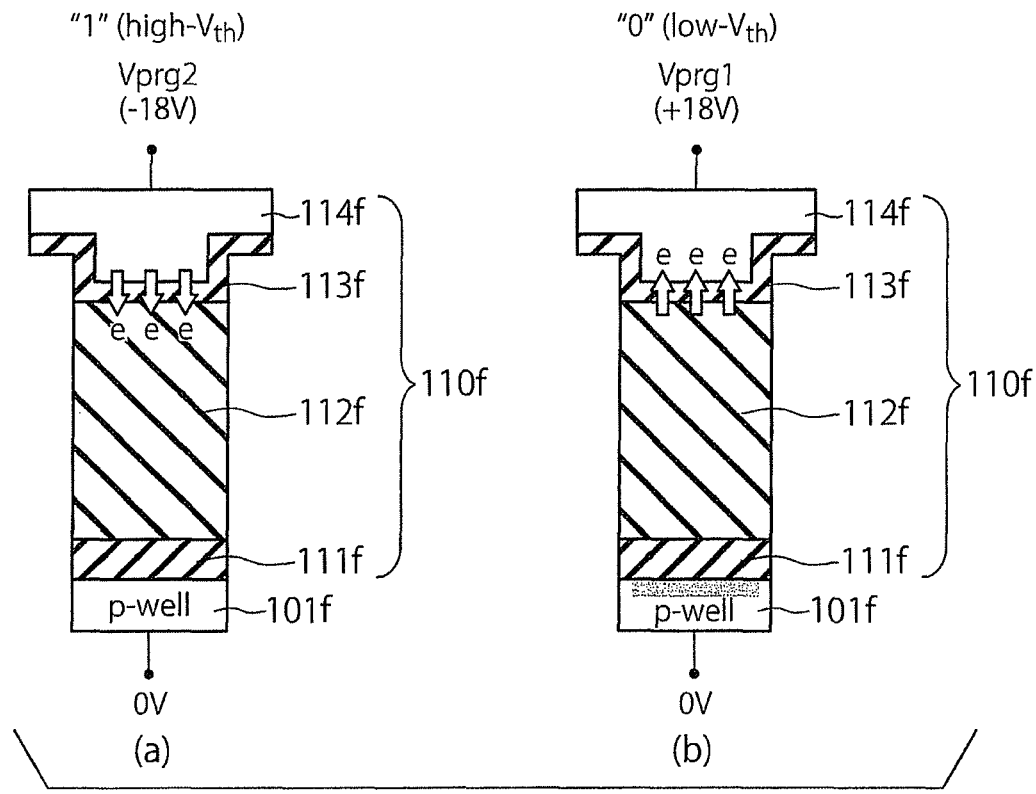
FIGS. 29(a) and 29(b) are diagrams showing write voltages in the n-channel memory transistor.

FIGS. 29(a) and 29(b) show write voltages in the memory transistor 10f. As shown in FIG. 29(a), in a case where the voltage applied to the source/drain regions 102f and the p-well 101f is 0 V, and the second write voltage Vprg2 (−18 V) is applied to the gate electrode 114f in the memory transistor 10f, electrons in the gate electrode 114f pass through the insulating film 113f by virtue of a tunneling phenomenon, and are injected into the charge storage film 112f. The injected electrons are trapped and stored in the charge storage film 112f. Since the facing area of the gate electrode 114f with respect to the charge storage film 112f is smaller than the facing area of the channel with respect to the charge storage film 112f in the memory transistor 10f, the amount of electrons flowing from the charge storage film 112f to the channel is smaller than the amount of electrons injected from the gate electrode 114f. The negative charges stored in the charge storage film 112f increase the threshold voltage ($V_{th}$) of the n-channel memory transistor 10f to a high threshold. This high threshold is 4 V, for example.

As shown in FIG. 29(b), in a case where the voltage applied to the source/drain regions 102f and the p-well 101f is 0 V, and the first write voltage Vprg1 (+18 V) is applied to the gate electrode 114f while the memory transistor 10f is in a high threshold state, negative charges (electrons) stored in the charge storage film 112f pass through the insulating film 113f by virtue of a tunneling phenomenon, and are released into the gate electrode 114f. Since the facing area of the gate electrode 114f with respect to the charge storage film 112f is smaller than the facing area of the channel with respect to the charge storage film 112f in the memory transistor 10f, the amount of electrons flowing from the channel to the charge storage film 112f is smaller than the amount of electrons flowing from the charge storage film 112f to the gate electrode 114f. Because of this, the charge storage film 112f returns to the original neutral state, and accordingly, the threshold voltage becomes the original low threshold. This low threshold is 0 V, for example. If the first write voltage Vprg1 is applied to the memory transistor 10f in a state where no charges are stored in the charge storage film 112f (a low threshold state), no charges are transferred, and the low threshold state is maintained.

Figure 30:
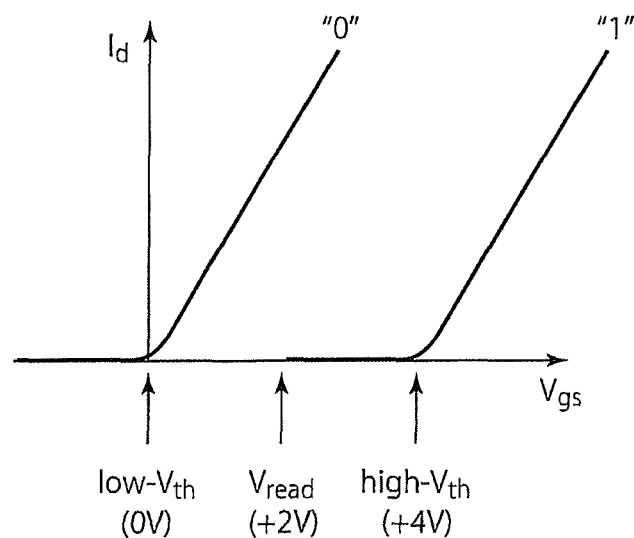
FIG. 30 is a graph showing the $I_d$-$V_{gs}$ characteristics of the n-channel memory transistor.

FIG. 30 shows the drain current ($I_d$)-gate voltage ($V_{gs}$) characteristics in a case where the memory transistor 10f is in a high threshold state and in a case where the memory transistor 10f is in a low threshold state.

Figure 4:
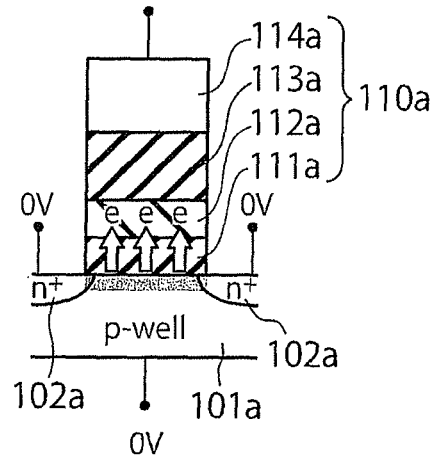
FIGS. 4(a) and 4(b) are diagrams showing write voltages in the first memory transistor.
Figure 4:
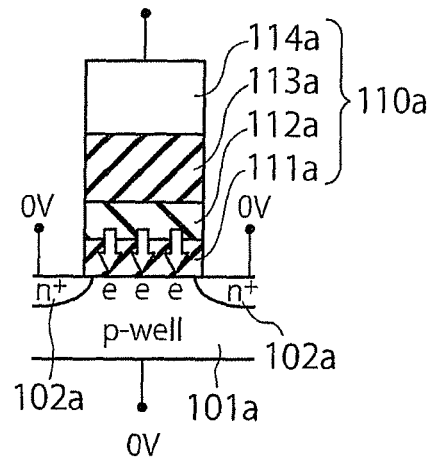

Operations of the cell 4F according to the fifth embodiment shown in FIG. 24 are the same as the operations of the cell 4A of the first specific example of the first embodiment shown in FIG. 4, for example. When the first write voltage Vprg1 (+18 V) is applied to the interconnect WL, the threshold voltage of the memory transistor 10e can be made higher, and the threshold voltage of the memory transistor 10f can be made lower, by the writing with a FN tunneling current. When the second write voltage Vprg2 (−18 V) is applied to the interconnect WL, the threshold voltage of the memory transistor 10e can be made lower, and the threshold voltage of the memory transistor 10f can be made higher.

Referring now to FIGS. 31 through 36(b), a method of manufacturing the memory transistors 10e and 10f is described. FIGS. 31 through 36(b) are cross-sectional views for explaining the method of manufacturing the memory transistors 10e and 10f.

Figure 31:
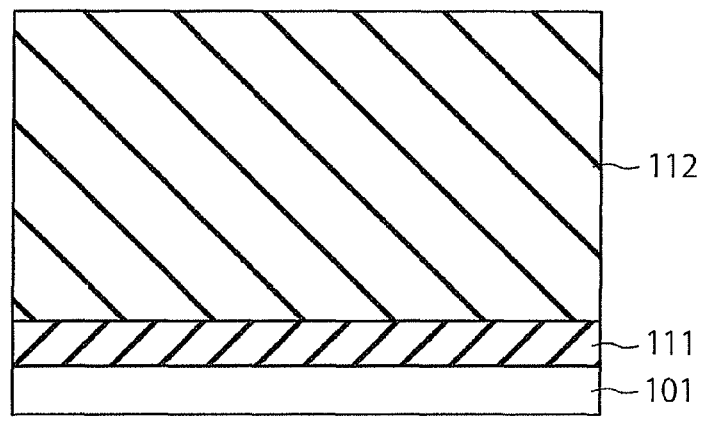
FIG. 31 is a cross-sectional view illustrating a method of forming memory transistors according to the fifth embodiment.
Figure 32:
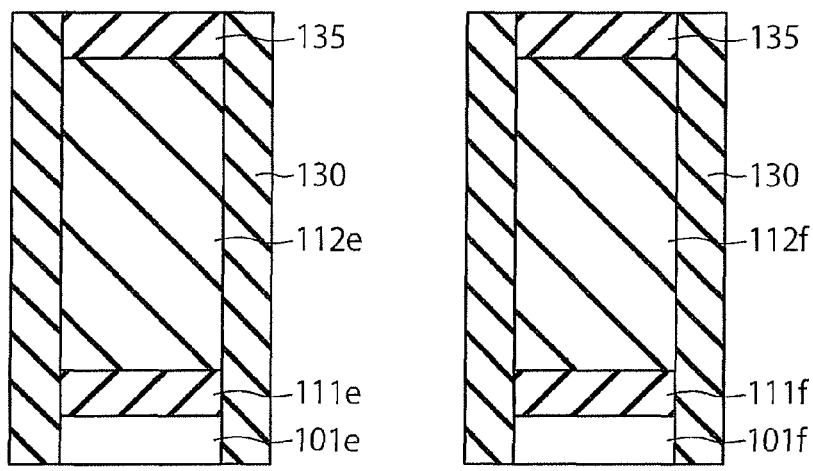
FIGS. 32(a) and 32(b) are cross-sectional views illustrating a method of forming memory transistors according to the fifth embodiment.
Figure 33:
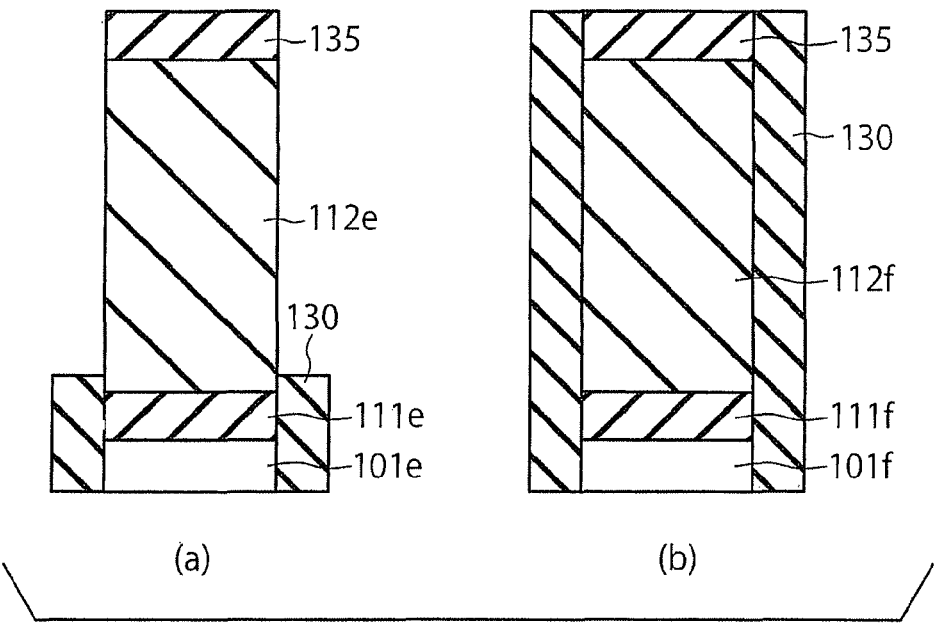
FIGS. 33(a) and 33(b) are cross-sectional views illustrating a method of forming memory transistors according to the fifth embodiment.
Figure 34:
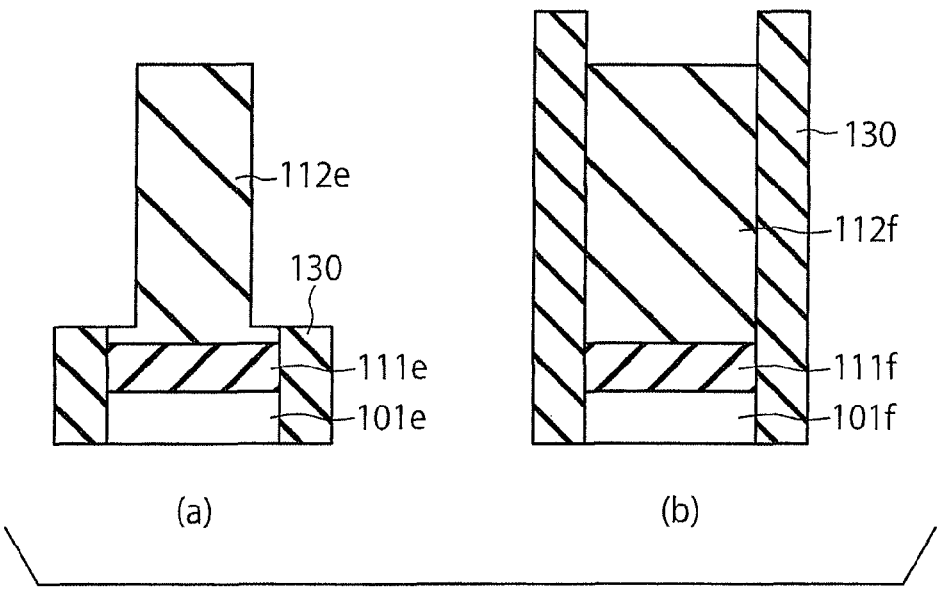
FIGS. 34(a) and 34(b) are cross-sectional views illustrating a method of forming memory transistors according to the fifth embodiment.
Figure 35:
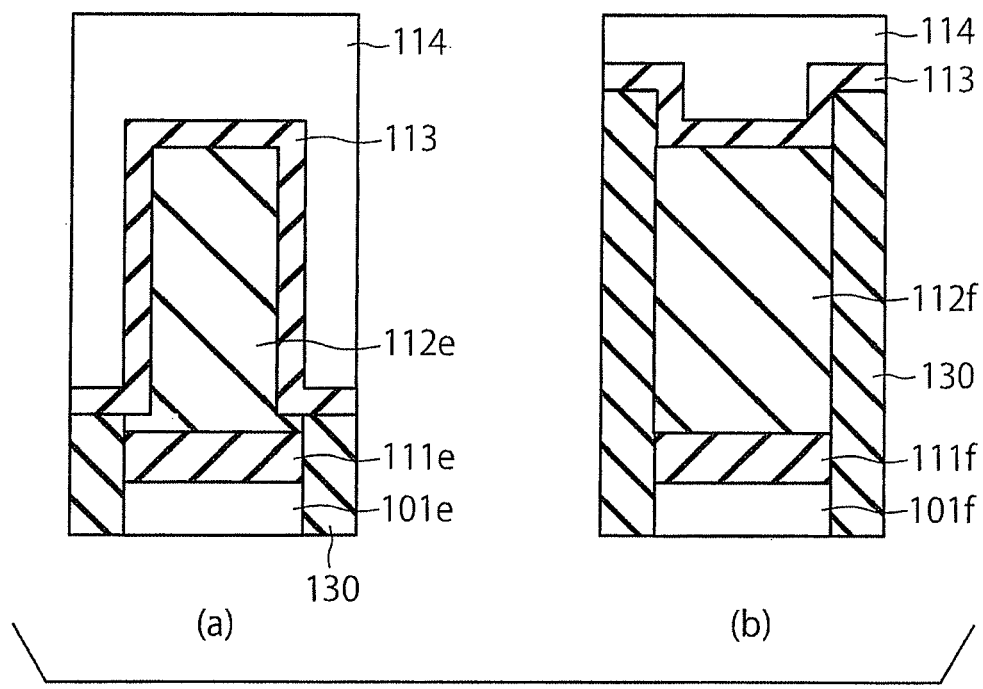
FIGS. 35(a) and 35(b) are cross-sectional views illustrating a method of forming memory transistors according to the fifth embodiment.
Figure 36:
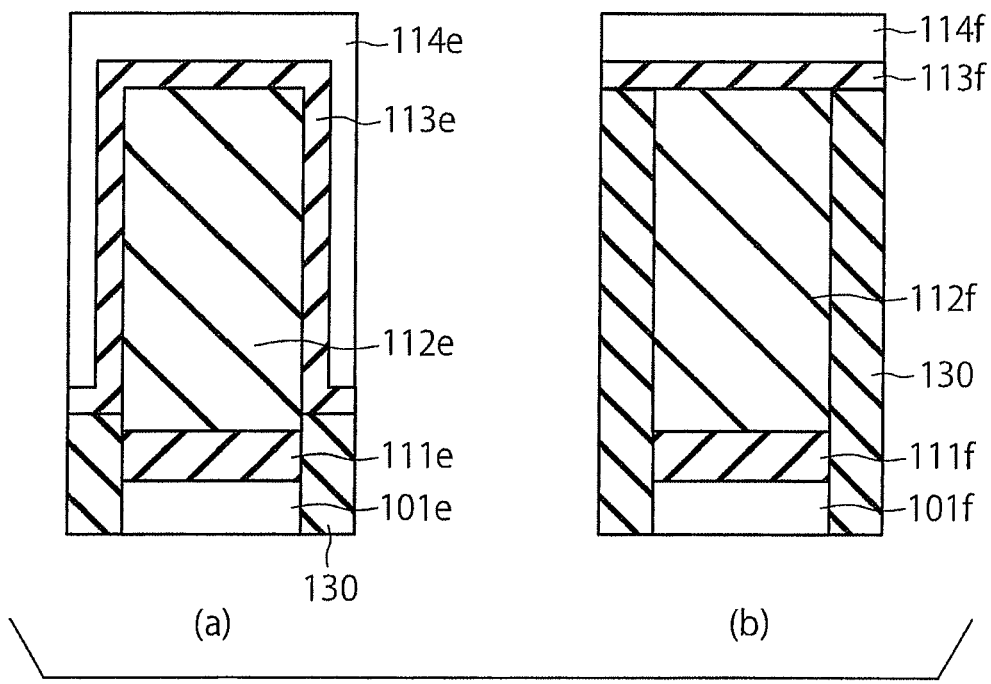
FIGS. 36(a) and 36(b) are cross-sectional views illustrating another example of a method of forming the memory transistors according to the fifth embodiment.

First, as shown in FIG. 31, an insulating film 111 is formed on a p-well 101 of a semiconductor substrate, and a charge storage film 112 is formed on the insulating film 111.

After patterning is performed through a PEP (Photo Engraving Process), for example, anisotropic dry etching is performed, to divide the charge storage film 112, the insulating film 111, and the well 101. As a result of this, the well 101 is divided into the formation region 101e of the memory transistor 10e and the formation region 101f of the memory transistor 10f. The insulating film 111e and the charge storage film 112e are left on the well 101e, and the insulating film 111f and the charge storage film 112f are left on the well 101f. The region from which the charge storage film 112, the insulating film 111, and the well region 101 are removed by the dividing is filled with an insulating film 130 such as a silicon oxide ($SiO_2$) film, and flattening is performed using CMP (Chemical Mechanical Polishing), for example (FIGS. 32(a) and 32(b)). A hard mask 135 made of SiN or the like can be deposited on the charge storage film 112 prior to the PEP, if necessary. This situation is shown in FIGS. 32(a) and 32(b). Immediately after this and in the following procedures, the hard mask 135 is removed by wet etching, for example.

After patterning is performed through a PEP, for example, anisotropic dry etching is performed, to process the embedded insulating film 130 in the formation region of the memory transistor 10e. This situation is shown in FIGS. 33(a) and 33(b). At this point, the embedded insulating film 130 in the formation region of the memory transistor 10f is protected by patterning, and is not processed.

Isotropic wet etching is then performed, for example, to process the charge storage films 112e and 112f. At this point, the embedded insulating film 130 is processed in the formation region of the memory transistor 10e. Therefore, side etching is performed not only in the direction perpendicular to the well 101e but also in the direction parallel to the well 101e. This situation is shown in FIGS. 34(a) and 34(b). At this point, etching is performed only in the direction perpendicular to the well 101f in the formation region of the memory transistor 10f.

As shown in FIGS. 35(a) and 35(b), after an insulating film 113 is formed, a gate electrode 114 is formed.

After patterning is performed through a PEP, for example, anisotropic dry etching is performed, to process the gate electrode 114, the insulating film 113, the charge storage films 112e and 112f, and the insulating films 111e and 111f in the direction perpendicular to the depth direction of FIGS. 35(a) and 35(b), and divide the gate electrode 114 into the gate electrodes 114e and 114f and the insulating film 113 into the insulating films 113e and 113f. As a result, the memory transistor 10e and the memory transistor 10f are formed. The insulating film 113 cannot be divided where appropriate.

The advantages of the cell 4F of the fifth embodiment over the cell 4A of the first specific example of the first embodiment, the cell 4B of the third embodiment, and the cell 4E of the fourth embodiment are that only the single step of performing a PEP is added to the standard process in manufacturing the memory transistor 10e and the memory transistor 10f separately from each other, and the memory transistor 10e and the memory transistor 10f can be produced at low costs. In this case, the memory transistor 10e and the memory transistor 10f in the fifth embodiment can have any of the structures of the first, third, and fourth embodiments. In the cell of the fifth embodiment, an n-channel memory transistor is used as the memory transistor 10f. However, even if a p-channel memory transistor that is described as the memory transistor 10d is used, for example, switching operations can be performed as illustrated in FIG. 17.

If the memory transistor 10e and the memory transistor 10f are designed to have different structures with each other, the memory transistor 10e is designed to have the same structure as the memory transistor 10a, and the memory transistor 10f is designed to have the same structure as the memory transistor 10b. With this arrangement, the difference between the operations by the two transistors in response to the same write voltage becomes larger, and the switching operations illustrated in FIGS. 28 and 30 can be made more distinctive.

A feature of the fifth embodiment is that the contact area of the gate electrode with respect to the charge storage film differs between the memory transistor 10e and the memory transistor 10f. Therefore, the memory transistor 10e and the memory transistor 10f cannot have the structures shown in FIGS. 25(a) and 25(b) and FIGS. 26(a) and 26(b). FIGS. 36(a) and 36(b) show structures that are formed by skipping the etching process in the steps illustrated in FIGS. 33(a) and 33(b) and FIGS. 34(a) and 34(b), and performing film formation illustrated in FIGS. 35(a) and 35(b) instead. In these structures, the difference in contact area of the gate electrode with respect to the charge storage film between the two transistors is smaller than that in the structures shown in FIGS. 25(a) and 25(b) and FIGS. 26(a) and 26(b). However, the etching step can be skipped, and the production costs can be lowered accordingly. By performing the etching illustrated in FIGS. 34(a) and 34(b), on the other hand, filling can be performed even if the distance between the cells adjacent to each other via the well dividing region is smaller, when the insulating film 113 and the electrode 114 are formed. Accordingly, the interference effect to allow a capacitance between the adjacent charge storage films can be restrained, and higher integration is advantageously achieved.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

The invention claimed is:

1. A nonvolatile programmable switch comprising:
a first nonvolatile memory transistor including a first terminal connected to a first interconnect, a second terminal connected to a second interconnect, and a third terminal connected to a third interconnect;
a second nonvolatile memory transistor including a fourth terminal connected to a fourth interconnect, a fifth terminal connected to the second interconnect, and a sixth terminal connected to the third interconnect, the second nonvolatile memory transistor being of the same conductivity type as a conductivity type of the first nonvolatile memory transistor; and
a pass transistor having a gate electrode connected to the second interconnect, wherein
when the first interconnect and the fourth interconnect are connected to a first power supply while the third interconnect is connected to a second power supply of a higher voltage than a voltage of the first power supply, a threshold voltage of the first nonvolatile memory transistor increases, and a threshold voltage of the second nonvolatile memory transistor decreases, and
when the first interconnect and the fourth interconnect are connected to the first power supply while the third interconnect is connected to a third power supply of a lower voltage than the voltage of the first power supply, the threshold voltage of the first nonvolatile memory transistor decreases, and the threshold voltage of the second nonvolatile memory transistor increases.

2. The switch according to claim 1, wherein
the first nonvolatile memory transistor includes first source/drain regions formed at a distance from each other in a semiconductor region and a first gate structure formed on a portion of the semiconductor region, the portion being located between the first source/drain regions, the first gate structure being formed by stacking a first insulating film, a first charge storage film, a second insulating film with a greater film thickness than a film thickness of the first insulating film, and a first gate electrode in this order, one of the first source/drain regions being the first terminal, the other one of the first source/drain regions being the second terminal, the first gate electrode being the third terminal, and
the second nonvolatile memory transistor includes second source/drain regions formed at a distance from each other in the semiconductor region and a second gate structure formed on a portion of the semiconductor region, the portion being located between the second source/drain regions, the second gate structure being formed by stacking a third insulating film, a second charge storage film, a fourth insulating film with a smaller film thickness than a film thickness of the third insulating film, and a second gate electrode in this order, one of the second source/drain regions being the fourth terminal, the other one of the second source/drain regions being the fifth terminal, the second gate electrode being the sixth terminal.

3. The switch according to claim 1, wherein
the first nonvolatile memory transistor includes first source/drain regions formed at a distance from each other in a semiconductor region and a first gate structure formed on a portion of the semiconductor region, the portion being located between the first source/drain regions, the first gate structure being formed by stacking a first insulating film, a first charge storage film, a second insulating film with a higher mean relative permittivity than a mean relative permittivity of the first insulating film, and a first gate electrode in this order, one of the first source/drain regions being the first terminal, the other one of the first source/drain regions being the second terminal, the first gate electrode being the third terminal, and
the second nonvolatile memory transistor includes second source/drain regions formed at a distance from each other in the semiconductor region and a second gate structure formed on a portion of the semiconductor region, the portion being located between the second source/drain regions, the second gate structure being formed by stacking a third insulating film, a second charge storage film, a fourth insulating film with a lower mean relative permittivity than a mean relative permittivity of the third insulating film, and a second gate electrode in this order, one of the second source/drain regions being the fourth terminal, the other one of the second source/drain regions being the fifth terminal, the second gate electrode being the sixth terminal.

4. The switch according to claim 2, wherein the second insulating film and the third insulating film each have a stack structure in which a first material layer is interposed between second material layers having a lower electron affinity than an electron affinity of the first material layer.

5. The switch according to claim 1, wherein
the first nonvolatile memory transistor includes first source/drain regions formed at a distance from each other in a semiconductor region and a first gate structure formed on a portion of the semiconductor region, the portion being located between the first source/drain regions, the first gate structure being formed by stacking a first insulating film, a first charge storage film, a second insulating film, and a first gate electrode in this order, one of the first source/drain regions being the first terminal, the other one of the first source/drain regions being the second terminal, the first gate electrode being the third terminal,
the second nonvolatile memory transistor includes second source/drain regions formed at a distance from each other in the semiconductor region and a second gate structure formed on a portion of the semiconductor region, the portion being located between the second source/drain regions, the second gate structure being formed by stacking a third insulating film, a second charge storage film, a fourth insulating film, and a second gate electrode in this order, one of the second source/drain regions being the fourth terminal, the other one of the second source/drain regions being the fifth terminal, the second gate electrode being the sixth terminal, and
a facing area of the first gate electrode with respect to the first charge storage film in the first nonvolatile memory transistor is larger than a facing area of the second gate electrode with respect to the second charge storage film in the second nonvolatile memory transistor, the second insulating film being interposed between the first charge storage film and the first gate electrode, the fourth insulating film being interposed between the second charge storage film and the second gate electrode.

6. The switch according to claim 5, wherein the second insulating film covers an upper face and part of side faces of the first charge storage film, and the first gate electrode covers an upper face and side faces of the second insulating film.

7. The switch according to claim 1, wherein, when the first interconnect and the fourth interconnect are connected to a fourth power supply of a higher voltage than the voltage of the first power supply, the threshold voltages of the first and second nonvolatile memory transistors do not vary even though the third interconnect is connected to the second power supply or the third power supply.

* * * * *